United States Patent
Tezuka et al.

(10) Patent No.: US 9,018,629 B2
(45) Date of Patent: Apr. 28, 2015

(54) SEMICONDUCTOR DEVICE AND METHOD FOR MANUFACTURING SEMICONDUCTOR DEVICE

(71) Applicant: Semiconductor Energy Laboratory Co., Ltd., Atsugi-shi, Kanagawa-ken (JP)

(72) Inventors: Sachiaki Tezuka, Atsugi (JP); Atsuo Isobe, Isehara (JP); Takehisa Hatano, Atsugi (JP); Kazuya Hanaoka, Fujisawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 13/646,084

(22) Filed: Oct. 5, 2012

(65) Prior Publication Data
US 2013/0092940 A1 Apr. 18, 2013

(30) Foreign Application Priority Data
Oct. 13, 2011 (JP) .................................. 2011-225693

(51) Int. Cl.
*H01L 29/04* (2006.01)
*H01L 29/786* (2006.01)
(Continued)

(52) U.S. Cl.
CPC ...... *H01L 29/7869* (2013.01); *H01L 29/41733* (2013.01); *H01L 29/41783* (2013.01); *H01L 29/66969* (2013.01)

(58) Field of Classification Search
CPC ............ H01L 29/7869; H01L 27/1225; H01L 29/66742; H01L 29/66765; H01L 29/786; H01L 33/08

USPC ............. 257/43, E29.296; 438/596, 585, 104
See application file for complete search history.

(56) References Cited

U.S. PATENT DOCUMENTS 4,714,519 A * 12/1987 Pfiester ......................... 438/304
5,731,856 A 3/1998 Kim et al.
(Continued)

FOREIGN PATENT DOCUMENTS

EP 1737044 A 12/2006
EP 2226847 A 9/2010
(Continued)

OTHER PUBLICATIONS

Fortunato.E et al., "Wide-Bandgap High-Mobility ZnO Thin-Film Transistors Produced at Room Temperature,", Appl. Phys. Lett. (Applied Physics Letters), Sep. 27, 2004, vol. 85, No. 13, pp. 2541-2543
(Continued)

*Primary Examiner* — Matthew W Such
*Assistant Examiner* — Samuel Lair
(74) *Attorney, Agent, or Firm* — Eric J. Robinson; Robinson Intellectual Property Law Office, P.C.

(57) ABSTRACT

To provide a miniaturized transistor having high electric characteristics. A conductive film to be a source electrode layer and a drain electrode layer is formed to cover an oxide semiconductor layer and a channel protection layer, and then a region of the conductive film, which overlaps with the oxide semiconductor layer and the channel protection layer, is removed by chemical mechanical polishing treatment. Precise processing can be performed accurately because an etching step using a resist mask is not performed in the step of removing part of the conductive film to be the source electrode layer and the drain electrode layer. With the channel protection layer, damage to the oxide semiconductor layer or a reduction in film thickness due to the chemical mechanical polishing treatment on the conductive film can be suppressed.

20 Claims, 15 Drawing Sheets

(51) Int. Cl.
*H01L 29/417* (2006.01)
*H01L 29/66* (2006.01)

(56) References Cited

U.S. PATENT DOCUMENTS

| | | | |
|---|---|---|---|
| 5,744,864 A | 4/1998 | Cillessen et al. | |
| 5,851,861 A | 12/1998 | Suzawa et al. | |
| 6,294,274 B1 | 9/2001 | Kawazoe et al. | |
| 6,563,174 B2 | 5/2003 | Kawasaki et al. | |
| 6,727,522 B1 | 4/2004 | Kawasaki et al. | |
| 7,049,190 B2 | 5/2006 | Takeda et al. | |
| 7,061,014 B2 | 6/2006 | Hosono et al. | |
| 7,064,346 B2 | 6/2006 | Kawasaki et al. | |
| 7,105,868 B2 | 9/2006 | Nause et al. | |
| 7,211,825 B2 | 5/2007 | Shih et al | |
| 7,282,782 B2 | 10/2007 | Hoffman et al. | |
| 7,297,977 B2 | 11/2007 | Hoffman et al. | |
| 7,323,356 B2 | 1/2008 | Hosono et al. | |
| 7,385,224 B2 | 6/2008 | Ishii et al. | |
| 7,402,506 B2 | 7/2008 | Levy et al. | |
| 7,411,209 B2 | 8/2008 | Endo et al. | |
| 7,453,065 B2 | 11/2008 | Saito et al. | |
| 7,453,087 B2 | 11/2008 | Iwasaki | |
| 7,462,862 B2 | 12/2008 | Hoffman et al. | |
| 7,468,304 B2 | 12/2008 | Kaji et al. | |
| 7,501,293 B2 | 3/2009 | Ito et al. | |
| 7,674,650 B2 | 3/2010 | Akimoto et al. | |
| 7,727,854 B2* | 6/2010 | Maekawa et al. | 438/406 |
| 7,732,819 B2 | 6/2010 | Akimoto et al. | |
| 7,868,957 B2* | 1/2011 | Yamazaki et al. | 349/43 |
| 7,910,920 B2* | 3/2011 | Park et al. | 257/40 |
| 8,247,965 B2* | 8/2012 | Yamazaki et al. | 313/506 |
| 8,274,077 B2* | 9/2012 | Akimoto et al. | 257/43 |
| 8,669,550 B2* | 3/2014 | Akimoto et al. | 257/43 |
| 2001/0046027 A1 | 11/2001 | Tai et al. | |
| 2002/0056838 A1 | 5/2002 | Ogawa | |
| 2002/0132454 A1 | 9/2002 | Ohtsu et al. | |
| 2003/0189401 A1 | 10/2003 | Kido et al. | |
| 2003/0218222 A1 | 11/2003 | Wager et al. | |
| 2004/0038446 A1 | 2/2004 | Takeda et al. | |
| 2004/0127038 A1 | 7/2004 | Carcia et al. | |
| 2005/0017302 A1 | 1/2005 | Hoffman | |
| 2005/0199959 A1 | 9/2005 | Chiang et al. | |
| 2006/0035452 A1 | 2/2006 | Carcia et al. | |
| 2006/0043377 A1 | 3/2006 | Hoffman et al. | |
| 2006/0091793 A1 | 5/2006 | Baude et al. | |
| 2006/0108529 A1 | 5/2006 | Saito et al. | |
| 2006/0108636 A1 | 5/2006 | Sano et al. | |
| 2006/0110867 A1 | 5/2006 | Yabuta et al. | |
| 2006/0113536 A1 | 6/2006 | Kumomi et al. | |
| 2006/0113539 A1 | 6/2006 | Sano et al. | |
| 2006/0113549 A1 | 6/2006 | Den et al. | |
| 2006/0113565 A1 | 6/2006 | Abe et al. | |
| 2006/0169973 A1 | 8/2006 | Isa et al. | |
| 2006/0170111 A1 | 8/2006 | Isa et al. | |
| 2006/0197092 A1 | 9/2006 | Hoffman et al. | |
| 2006/0208977 A1 | 9/2006 | Kimura | |
| 2006/0228974 A1 | 10/2006 | Thelss et al. | |
| 2006/0231882 A1 | 10/2006 | Kim et al. | |
| 2006/0238135 A1 | 10/2006 | Kimura | |
| 2006/0244107 A1 | 11/2006 | Sugihara et al. | |
| 2006/0284171 A1 | 12/2006 | Levy et al. | |
| 2006/0284172 A1 | 12/2006 | Ishii | |
| 2006/0292777 A1 | 12/2006 | Dunbar | |
| 2007/0024187 A1 | 2/2007 | Shin et al. | |
| 2007/0046191 A1 | 3/2007 | Saito | |
| 2007/0052025 A1 | 3/2007 | Yabuta | |
| 2007/0054507 A1 | 3/2007 | Kaji et al. | |
| 2007/0090365 A1 | 4/2007 | Hayashi et al. | |
| 2007/0108446 A1 | 5/2007 | Akimoto | |
| 2007/0152217 A1 | 7/2007 | Lai et al. | |
| 2007/0172591 A1 | 7/2007 | Seo et al. | |
| 2007/0187678 A1 | 8/2007 | Hirao et al. | |
| 2007/0187760 A1 | 8/2007 | Furuta et al. | |
| 2007/0194379 A1 | 8/2007 | Hosono et al. | |
| 2007/0212842 A1 | 9/2007 | Maekawa | |
| 2007/0252928 A1 | 11/2007 | Ito et al. | |
| 2007/0272922 A1 | 11/2007 | Kim et al. | |
| 2007/0278490 A1* | 12/2007 | Hirao et al. | 257/64 |
| 2007/0287296 A1 | 12/2007 | Chang | |
| 2008/0006877 A1 | 1/2008 | Mardilovich et al. | |
| 2008/0038882 A1 | 2/2008 | Takechi et al. | |
| 2008/0038929 A1 | 2/2008 | Chang | |
| 2008/0050595 A1 | 2/2008 | Nakagawara et al. | |
| 2008/0073653 A1 | 3/2008 | Iwasaki | |
| 2008/0083950 A1 | 4/2008 | Pan et al. | |
| 2008/0106191 A1 | 5/2008 | Kawase | |
| 2008/0128689 A1 | 6/2008 | Lee et al. | |
| 2008/0129195 A1 | 6/2008 | Ishizaki et al. | |
| 2008/0166834 A1 | 7/2008 | Kim et al. | |
| 2008/0182358 A1 | 7/2008 | Cowdery-Corvan et al. | |
| 2008/0224133 A1 | 9/2008 | Park et al. | |
| 2008/0254569 A1 | 10/2008 | Hoffman et al. | |
| 2008/0258139 A1 | 10/2008 | Ito et al. | |
| 2008/0258140 A1 | 10/2008 | Lee et al. | |
| 2008/0258141 A1 | 10/2008 | Park et al. | |
| 2008/0258143 A1 | 10/2008 | Kim et al. | |
| 2008/0296568 A1 | 12/2008 | Ryu et al. | |
| 2008/0299702 A1* | 12/2008 | Son et al. | 438/104 |
| 2009/0068773 A1 | 3/2009 | Lai et al. | |
| 2009/0073325 A1 | 3/2009 | Kuwabara et al. | |
| 2009/0114910 A1 | 5/2009 | Chang | |
| 2009/0134399 A1 | 5/2009 | Sakakura et al. | |
| 2009/0140053 A1 | 6/2009 | Yamazaki et al. | |
| 2009/0152506 A1 | 6/2009 | Umeda et al. | |
| 2009/0152541 A1 | 6/2009 | Maekawa et al. | |
| 2009/0278122 A1 | 11/2009 | Hosono et al. | |
| 2009/0280600 A1 | 11/2009 | Hosono et al. | |
| 2010/0006833 A1* | 1/2010 | Ha et al. | 257/43 |
| 2010/0025677 A1* | 2/2010 | Yamazaki et al. | 257/43 |
| 2010/0065835 A1* | 3/2010 | Inoue et al. | 257/43 |
| 2010/0065844 A1* | 3/2010 | Tokunaga | 257/43 |
| 2010/0092800 A1 | 4/2010 | Itagaki et al. | |
| 2010/0109002 A1 | 5/2010 | Itagaki et al. | |
| 2010/0117077 A1* | 5/2010 | Yamazaki et al. | 257/43 |
| 2010/0187524 A1 | 7/2010 | Isobe et al. | |
| 2011/0089414 A1 | 4/2011 | Yamazaki et al. | |
| 2011/0133177 A1* | 6/2011 | Suzawa et al. | 257/43 |
| 2011/0140097 A1* | 6/2011 | Cheong et al. | 257/43 |
| 2011/0147740 A1* | 6/2011 | Jeong et al. | 257/43 |
| 2011/0156022 A1* | 6/2011 | Yamazaki et al. | 257/43 |
| 2011/0193080 A1 | 8/2011 | Yamazaki et al. | |
| 2011/0204355 A1* | 8/2011 | Suzuki et al. | 257/43 |
| 2011/0210326 A1 | 9/2011 | Suzawa et al. | |
| 2011/0297930 A1* | 12/2011 | Choi et al. | 257/43 |
| 2012/0086000 A1 | 4/2012 | Mizoguchi et al. | |
| 2012/0094433 A1 | 4/2012 | Mizoguchi et al. | |
| 2012/0126224 A1 | 5/2012 | Arai | |
| 2012/0161121 A1 | 6/2012 | Yamazaki | |
| 2012/0161124 A1 | 6/2012 | Yamazaki | |
| 2012/0161125 A1 | 6/2012 | Yamazaki | |
| 2012/0161126 A1 | 6/2012 | Yamazaki | |
| 2012/0178224 A1 | 7/2012 | Yamazaki | |
| 2012/0187396 A1 | 7/2012 | Yamazaki et al. | |
| 2012/0187397 A1 | 7/2012 | Yamazaki et al. | |
| 2012/0225520 A1 | 9/2012 | Suzawa et al. | |
| 2012/0228606 A1 | 9/2012 | Koezuka et al. | |
| 2013/0043467 A1* | 2/2013 | Takechi et al. | 257/43 |
| 2013/0087790 A1 | 4/2013 | Yamazaki | |
| 2013/0092928 A1 | 4/2013 | Yamazaki | |
| 2013/0092943 A1 | 4/2013 | Hatano et al. | |
| 2013/0140557 A1* | 6/2013 | Miyairi et al. | 257/43 |
| 2013/0328044 A1* | 12/2013 | Yamazaki et al. | 257/43 |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |

(56) References Cited

FOREIGN PATENT DOCUMENTS

| | | |
|---|---|---|
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2007-096055 A | 4/2007 |
| JP | 2007-123861 A | 5/2007 |
| WO | WO-2004/114391 | 12/2004 |

OTHER PUBLICATIONS

Dembo.H et al., "RFCPUS on Glass and Plastic Substrates Fabricated by TFT Transfer Technology,", IEDM 05: Technical Digest of International Electron Devices Meeting, Dec. 5, 2005, pp. 1067-1069

Ikeda.T et al., "Full-Functional System Liquid Crystal Display Using CG-Silicon Technology,". SID Digest '04 : SID International Symposium Digest of Technical Papers, 2004, vol. 35, pp. 860-863

Nomura.K et al., "Room-Temperature Fabrication of Transparent Flexible Thin-Film Transistors Using Amorphous Oxide Semiconductors,", Nature, Nov. 25, 2004, vol. 432, pp. 488-492.

Park.J et al., "Improvements in the Device Characteristics of Amorphous Indium Gallium Zinc Oxide Thin-Film Transistors by Ar Plasma Treatment,", Appl. Phys. Lett. (Applied Physics Letters) , Jun. 26, 2007, vol. 90, No. 26, pp. 262106-1-262106-3.

Takahashi.M et al., "Theoretical Analysis of IGZO Transparent Amorphous Oxide Semiconductor,", IDW '08 : Proceedings of the 15th International Display Workshops, Dec. 3, 2008, pp. 1637-1640.

Hayashi.R et al., "42.1: Invited Paper: Improved Amorphous In—Ga—Zn—O TFTs,", SID Digest '08 : SID International Symposium Digest of Technical Papers, May 20, 2008, vol. 39, pp. 621-624.

Prins.M et al., "A Ferroelectric Transparent Thin-Film Transistor,", Appl. Phys. Lett. (Applied Physics Letters) , Jun. 17, 1996, vol. 68, No. 25, pp. 3650-3652

Nakamura.M et al., "The phase relations in the In2O3—Ga2ZnO4—ZnO system at 1350° C.,", Journal of Solid State Chemistry, Aug. 1, 1991, vol. 93, No. 2, pp. 298-315.

Kimizuka.N. et al., "Syntheses and Single-Crystal Data of Homologous Compounds, In2O3(ZnO)m (m = 3, 4, and 5), InGaO3(ZnO)3, and Ga2O3(ZnO)m (m = 7, 8, 9, and 16) in the In2O3—ZnGa2O4—ZnO System,", Journal of Solid State Chemistry, Apr. 1, 1995, vol. 116, No. 1, pp. 170-178.

Nomura.K et al., "Thin-Film Transistor Fabricated in Single-Crystalline Transparent Oxide Semiconductor,", Science, May 23, 2003, vol. 300, No. 5623, pp. 1269-1272.

Masuda.S et al., "Transparent thin film transistors using ZnO as an active channel layer and their electrical properties,", J. Appl. Phys. (Journal of Applied Physics) , Feb. 1, 2003, vol. 93, No. 3, pp. 1624-1630.

Asakuma.N et al., "Crystallization and Reduction of Sol-Gel-Derived Zinc Oxide Films by Irradiation With Ultraviolet Lamp,", Journal of Sol-Gel Science and Technology, 2003, vol. 26, pp. 181-184.

Osada.T et al., "15.2: Development of Driver-Integrated Panel using Amorphous In—Ga—Zn—Oxide TFT,", SID Digest '09 : SID International Symposium Digest of Technical Papers, May 31, 2009, pp. 184-187.

Nomura.K et al., "Carrier transport in transparent oxide semiconductor with intrinsic structural randomness probed using single-crystalline InGaO3(ZnO)5 films,", Appl. Phys. Lett. (Applied Physics Letters) , Sep. 13, 2004, vol. 85, No. 11, pp. 1993-1995.

Li.C et al., "Modulated Structures of Homologous Compounds InMO3(ZnO)m (M=In,Ga; m=Integer) Described by Four-Dimensional Superspace Group,", Journal of Solid State Chemistry, 1998, vol. 139, pp. 347-355.

Son.K et al., "42.4L: Late-News Paper: 4 Inch QVGA AMOLED Driven by the Threshold Voltage Controlled Amorphous GIZO (Ga2O3—In2O3—ZnO) TFT,", SID Digest '08 : SID International Symposium Digest of Technical Papers, May 20, 2008, vol. 39, pp. 633-636.

Lee.J et al., "World'S Largest (15-Inch) XGA AMLCD Panel Using IGZO Oxide TFT,", SID Digest '08 : SID International Symposium Digest of Technical Papers, May 20, 2008, vol. 39, pp. 625-628.

Nowatari.H et al., "60.2: Intermediate Connector With Suppressed Voltage Loss for White Tandem OLEDs,", SID Digest '09 : SID International Symposium Digest of Technical Papers, May 31, 2009, vol. 40, pp. 899-902.

Kanno.H et al., "White Stacked Electrophosphorecent Organic Light-Emitting Devices Employing MOO3 as a Charge-Generation Layer,", Adv. Mater. (Advanced Materials), 2006, vol. 18, No. 3, pp. 339-342.

Tsuda.K et al., "Ultra Low Power Consumption Technologies for Mobile TFT-LCDs ,", IDW '02 : Proceedings of the 9th International Display Workshops, Dec. 4, 2002, pp. 295-298.

Van de Walle.C, "Hydrogen as a Cause of Doping in Zinc Oxide,", Phys. Rev. Lett. (Physical Review Letters), Jul. 31, 2000, vol. 85, No. 5, pp. 1012-1015.

Fung.T et al., "2-D Numerical Simulation of High Performance Amorphous In—Ga—Zn—O TFTs for Flat Panel Displays,", AM-FPD '08 Digest of Technical Papers, Jul. 2, 2008, pp. 251-252, The Japan Society of Applied Physics.

Jeong.J et al., "3.1: Distinguished Paper: 12.1-Inch WXGA AMOLED Display Driven by Indium-Gallium-Zinc Oxide TFTs Array,", SID Digest '08 : SID International Symposium Digest of Technical Papers, May 20, 2008, vol. 39, No. 1, pp. 1-4.

Park.J et al., "High performance amorphous oxide thin film transistors with self-aligned top-gate structure,", IEDM 09: Technical Digest of International Electron Devices Meeting, Dec. 7, 2009, pp. 191-194.

Kurokawa.Y et al., "UHF RFCPUS on Flexible and Glass Substrates for Secure RFID Systems,", Journal of Solid-State Circuits , 2008, vol. 43, No. 1, pp. 292-299.

Ohara.H et al., "Amorphous In—Ga—Zn—Oxide TFTs with Suppressed Variation for 4.0 inch QVGA AMOLED Display,", AM-FPD '09 Digest of Technical Papers, Jul. 1, 2009, pp. 227-230, The Japan Society of Applied Physics.

Coates.D et al., "Optical Studies of the Amorphous Liquid-Cholesteric Liquid Crystal Transition:The "Blue Phase",", Physics Letters, Sep. 10, 1973, vol. 45A, No. 2, pp. 115-116.

Cho.D et al., "21.2:AL and SN-Doped Zinc Indium Oxide Thin Film Transistors for AMOLED Back Plane,", SID Digest '09 : SID International Symposium Digest of Technical Papers, May 31, 2009, pp. 280-283.

Lee.M et al., "15.4:Excellent Performance of Indium-Oxide-Based Thin-Film Transistors by DC Sputtering,", SID Digest '09 : SID International Symposium Digest of Technical Papers, May 31, 2009, pp. 191-193.

Jin.D et al., "65.2:Distinguished Paper:World-Largest (6.5") Flexible Full Color Top Emission AMOLED Display on Plastic Film and its Bending Properties,", SID Digest '09 : SID International Symposium Digest of Technical Papers, May 31, 2009, pp. 983-985.

Sakata.J et al., "Development of 4.0-In. AMOLED Display With Driver Circuit Using Amorphous In—Ga—Zn—Oxide TFTs,", IDW '09 : Proceedings of the 16th International Display Workshop, 2009, pp 659-692.

Park.J et al., "Amorphous Indium-Gallium-Zinc Oxide TFTs and Their Application for Large Size AMOLED,", AM-FPD '08 Digest of Technical Papers, Jul. 2, 2008, pp. 275-278.

Park.S et al., "Challenge to Future Displays: Transparent AM-OLED Driven by Peald Grown ZnO TFT,", IMID '07 Digest, 2007, pp. 1249-1252.

Godo.H et al., "Temperature Dependence of Characteristics and Electronic Structure for Amorphous In—Ga—Zn—Oxide TFT,", AM-FPD '09 Digest of Technical Papers, Jul. 1, 2009, pp. 41-44.

Osada.T et al., "Development of Driver-Integrated Panel Using Amorphous In—Ga—Zn—Oxide TFT,", AM-FPD '09 Digest of Technical Papers, Jul. 1, 2009, pp. 33-36.

(56) References Cited

OTHER PUBLICATIONS

Hirao.T et al., "Novel Top-Gate Zinc Oxide Thin-Film Transistors (ZnO TFTs) for AMLCDs,", Journal of the SID, 2007, vol. 15, No. 1, pp. 17-22.
Hosono.H, "68.3:Invited Paper:Transparent Amorphous Oxide Semiconductors for High Performance TFT,", SID Digest '07 : SID International Symposium Digest of Technical Papers, 2007, vol. 38, pp. 1830-1833.
Godo.H et al., "P-9:Numerical Analysis on Temperature Dependence of Characteristics of Amorphous In—Ga—Zn—Oxide TFT,", SID Digest '09 : SID Internatinal Symposium Digest of Technical Papers, May 31, 2009, pp. 1110-1112.
Ohara.H et al., "21.3:4.0 In. QVGA AMOLED Display Using In—Ga—Zn—Oxide TFTs With a Novel Passivation Layer,", SID Digest '09 : SID International Symposium Digest of Technical Papers, May 31, 2009, pp. 284-287.
Miyasaka.M, "Suftla Flexible Microelectronics on Their Way to Business,", SID Digest '07 : SID International Symposium Digest of Technical Papers, 2007, vol. 38, pp. 1673-1676.
Chern.H et al., "An Analytical Model for the Above-Threshold Characteristics of Polysilicon Thin-Film Transistors,", IEEE Transactions on Electron Devices, Jul. 1, 1995, vol. 42, No. 7, pp. 1240-1246.
Kikuchi.H et al., "39.1:Invited Paper:Optically Isotropic Nano-Structured Liquid Crystal Composites for Display Applications,", SID Digest '09 : SID International Symposium Digest of Technical Papers, May 31, 2009, pp. 578-581
Asaoka.Y et al., "29.1:Polarizer-Free Reflective LCD Combined With Ultra Low-Power Driving Technology,", SID Digest '09 : SID International Symposium Digest of Technical Papers, May 31, 2009, pp. 395-398.
Lee.H et al., "Current Status of, Challenges to, and Perspective View of AM-OLED ,", IDW '06 : Proceedings of the 13th International Display Workshops, Dec. 7, 2006, pp. 663-666.
Kikuchi.H et al., "62.2:Invited Paper:Fast Electro-Optical Switching in Polymer-Stabilized Liquid Crystalline Blue Phases for Display Application,", SID Digest '07 : SID International Symposium Digest of Technical Papers, 2007, vol. 38, pp. 1737-1740.
Nakamura.M, "Synthesis of Homologous Compound with New Long-Period Structure,", NIRIM Newsletter, Mar. 1, 1995, vol. 150, pp. 1-4.
Kikuchi.H et al., "Polymer-Stabilized Liquid Crystal Blue Phases,", Nature Materials, Sep. 2, 2002, vol. 1, pp. 64-68.
Kimizuka.N et al., "Spinel,YBFe2O4, and YB2Fe3O7 Types of Structures for Compounds in the IN2O3 and SC2O3-A2O3-BO Systems [A; Fe, Ga, or Al; B: Mg, Mn, Fe Ni Cu,Or Zn] at temperatures over 1000° C.,", Journal of Solid State Chemistry, 1985, vol. 60, pp. 382-384.
Kitzerow.H et al., "Observation of Blue Phases in Chiral Networks,", Liquid Crystals, 1993, vol. 14, No. 3, pp. 911-916.
Costello.M et al., "Electron Microscopy of a Cholesteric Liquid Crystal and Its Blue Phase,", Phys. Rev. A (Physical Review. A), May 1, 1984, vol. 29, No. 5, pp. 2957-2959.
Meiboom.S et al., "Theory of the Blue Phase of Cholesteric Liquid Crystals,", Phys. Rev. Lett. (Physical Review Letters), May 4, 1981, vol. 46, No. 18, pp. 1216-1219.

Park.Sang-Hee et al., "42.3: Transparent ZnO Thin Film Transistor for the Application of High Aperture Ratio Bottom Emission AM-OLED Display,", SID Digest '08 : SID International Symposium Digest of Technical Papers, May 20, 2008, vol. 39, pp. 629-632.
Orita.M et al., "Mechanism of Electrical Conductivity of Transparent InGaZnO4,", Phys. Rev. B (Physical Review. B), Jan. 15, 2000, vol. 61, No. 3, pp. 1811-1816.
Nomura.K et al., "Amorphous Oxide Semiconductors for High-Performance Flexible Thin-Film Transistors,", Jpn. J. Appl. Phys. (Japanese Journal of Applied Physics) , 2006, vol. 45, No. 5B, pp. 4303-4308.
Janotti.A et al., "Native Point Defects in ZnO,", Phys. Rev. B (Physical Review. B), Oct. 4, 2007, vol. 76, No. 16, pp. 165202-1-165202-22.
Park.J et al., "Electronic Transport Properties of Amorphous Indium-Gallium-Zinc Oxide Semiconductor Upon Exposure to Water,", Appl. Phys. Lett. (Applied Physics Letters) , 2008, vol. 92, pp. 072104-1-072104-3.
Hsieh.H et al., "P-29:Modeling of Amorphous Oxide Semiconductor Thin Film Transistors and Subgap Density of States,", SID Digest '08 : SID International Symposium Digest of Technical Papers, 2008, vol. 39, pp. 1277-1280.
Janotti.A et al., "Oxygen Vacancies in ZnO,", Appl. Phys. Lett. (Applied Physics Letters) , 2005, vol. 87, pp. 122102-1-122102-3.
Oba.F et al., "Defect energetics in ZnO: A hybrid Hartree-Fock density functional study,", Phys. Rev. B (Physical Review. B), 2008, vol. 77, pp. 245202-1-245202-6.
Orita.M et al., "Amorphous transparent conductive oxide InGaO3(ZnO)m (m<4):a Zn4s conductor,", Philosophical Magazine, 2001, vol. 81, No. 5, pp. 501-515.
Hosono.H et al., "Working hypothesis to explore novel wide band gap electrically conducting amorphous oxides and examples,", J. Non-Cryst. Solids (Journal of Non-Crystalline Solids), 1996, vol. 198-200, pp. 165-169.
Mo.Y et al., "Amorphous Oxide TFT Backplanes for Large Size AMOLED Displays,", IDW '08 : Proceedings of the 6th International Display Workshops, Dec. 3, 2008, pp. 581-584.
Kim.S et al., "High-Performance oxide thin film transistors passivated by various gas plasmas,", 214th ECS Meeting, 2008, No. 2317, ECS.
Clark.S et al., "First Principles Methods Using CASTEP,", Zeitschrift fur Kristallographie, 2005, vol. 220, pp. 567-570.
Lany.S et al., "Dopability, Intrinsic Conductivity, and Nonstoichiometry of Transparent Conducting Oxides,", Phys. Rev. Lett. (Physical Review Letters), Jan. 26, 2007, vol. 98, pp. 045501-1-045501-4.
Park.J et al., "Dry etching of ZnO films and plasma-induced damage to optical properties,", J. Vac. Sci. Technol. B (Journal of Vacuum Science & Technology B), Mar. 1, 2003, vol. 21, No. 2, pp. 800-803.
Oh.M et al., "Improving the Gate Stability of ZnO Thin-Film Transistors With Aluminum Oxide Dielectric Layers,", J. Electrochem. Soc. (Journal of the Electrochemical Society), 2008, vol. 155, No. 12, pp. H1009-H1014.
Ueno.K et al., "Field-Effect Transistor on SrTiO3 With Sputtered Al2O3 Gate Insulator,", Appl. Phys. Lett. (Applied Physcis Letters) , Sep. 1, 2003, vol. 83, No. 9, pp. 1755-1757.

* cited by examiner

SEMICONDUCTOR DEVICE AND METHOD FOR MANUFACTURING SEMICONDUCTOR DEVICE

BACKGROUND OF THE INVENTION

1. Field of the Invention

The present invention relates to a semiconductor device and a method for manufacturing the semiconductor device.

In this specification and the like, a semiconductor device refers to all types of devices which can function by utilizing semiconductor characteristics; an electro-optical device, a light-emitting display device, a semiconductor circuit, and an electronic device are all semiconductor devices.

2. Description of the Related Art

A technique by which a transistor is formed using a semiconductor thin film formed over a substrate having an insulating surface has been attracting attention. The transistor is applied to a wide range of semiconductor electronic devices such as an integrated circuit (IC) and an image display device (also simply referred to as display device). A silicon-based semiconductor material is widely known as a material for a semiconductor thin film applicable to the transistor. As another material, an oxide semiconductor has been attracting attention.

For example, Patent Document 1 and Patent Document 2 disclose a technique by which a transistor is manufactured using zinc oxide or an In—Ga—Zn-based oxide as an oxide semiconductor and is used as a switching element or the like in a pixel of a display device.

REFERENCE

Patent Document

[Patent Document 1] Japanese Published Patent Application No. 2007-123861

[Patent Document 2] Japanese Published Patent Application No. 2007-96055

SUMMARY OF THE INVENTION

In order to achieve high-speed operation, low power consumption, high integration, or the like of a transistor, it is necessary to miniaturize the transistor.

Improvement in on-state characteristics (e.g., on-state current and field effect mobility) of a miniaturized transistor is needed to achieve quick response and high-speed operation of a semiconductor device. It is effective for suppressing a decrease in on-state current of a transistor to provide a region in which a gate electrode layer overlaps with a source electrode layer or a drain electrode layer with a gate insulating layer provided therebetween (hereinafter also referred to as Lov region in this specification).

Formation of the Lov region, however, needs precise alignment of an oxide semiconductor layer and a gate electrode layer each of which has a small line width. Higher precision is required with an increase in miniaturization of a transistor. Therefore, it is concerned that the yield of transistors in the manufacturing process is decreased due to miniaturization thereof.

As a method for miniaturizing a transistor, a method of cutting or processing a conductive film or the like, or improving the planarity of the conductive film or the like by polishing (cutting, grinding) of the conductive film or the like, in particular, chemical mechanical polishing (CMP) treatment is given. At the polishing treatment, however, a thin film used as a semiconductor layer is damaged, which leads to a decrease in transistor characteristics or variations in transistor characteristics.

Therefore, an object of one embodiment of the present invention is to provide a semiconductor device which is miniaturized while maintaining favorable characteristics.

Another object of one embodiment of the present invention is to provide a miniaturized transistor having high electric characteristics with a high yield.

In one embodiment of the disclosed invention, a conductive film to be a source electrode layer and a drain electrode layer is formed to cover an oxide semiconductor layer and a channel protection layer, and then a region of the conductive film which overlaps with the oxide semiconductor layer and the channel protection layer is removed by chemical mechanical polishing treatment. Precise processing can be performed accurately because an etching step using a resist mask is not performed in the step of removing the conductive film to be the source electrode layer and the drain electrode layer. Furthermore, in a cross section in the channel length direction, a sidewall layer having conductivity is provided on a side surface of the gate electrode layer so that the sidewall layer having conductivity overlaps with the source electrode layer or the drain electrode layer with the gate insulating layer provided therebetween, thereby manufacturing a transistor substantially including an Lov region.

In a manufacturing process of one embodiment of the disclosed invention, a channel protection layer is formed in a region overlapping with an oxide semiconductor layer; a conductive film to be a source electrode layer and a drain electrode layer is formed to cover the oxide semiconductor layer and the channel protection layer; and a region of the conductive film which overlaps with the oxide semiconductor layer and the channel protection layer is removed by chemical mechanical polishing treatment. With the channel protection layer, damage to the oxide semiconductor layer or a reduction in film thickness due to the chemical mechanical polishing treatment on the conductive film can be suppressed. Specifics are described below.

One embodiment of the present invention is a semiconductor device including a source electrode layer; a drain electrode layer; an oxide semiconductor layer; a channel protection layer in contact with a top surface of the oxide semiconductor layer; a gate insulating layer in contact with top surfaces of the channel protection layer, the source electrode layer, and the drain electrode layer; a gate electrode layer overlapping with the oxide semiconductor layer with the channel protection layer and the gate insulating layer provided therebetween; and a first sidewall layer and a second sidewall layer. In the semiconductor device, in a cross section in a channel length direction, one side surface of the oxide semiconductor layer is in contact with the source electrode layer and the other side surface of the oxide semiconductor layer is in contact with the drain electrode layer; in the cross section in the channel length direction, the first sidewall layer is in contact with one side surface of the gate electrode layer and the second sidewall layer is in contact with the other side surface of the gate electrode layer; at least a part of the first sidewall layer is provided over the source electrode layer with the gate insulating layer provided therebetween; at least a part of the second sidewall layer is provided over the drain electrode layer with the gate insulating layer provided therebetween; and the first sidewall layer and the second sidewall layer have conductivity.

Another embodiment of the present invention is a semiconductor device including a source electrode layer; a drain electrode layer; an oxide semiconductor layer; a gate insulating layer which is in contact with a top surface of the oxide semiconductor layer and which covers the source electrode layer and the drain electrode layer; a gate electrode layer overlapping with the oxide semiconductor layer with the gate insulating layer provided therebetween; and a first sidewall layer and a second sidewall layer. In the semiconductor device, in a cross section in a channel length direction, one side surface of the oxide semiconductor layer is in contact with the source electrode layer and the other side surface of the oxide semiconductor layer is in contact with the drain electrode layer; the first sidewall layer is in contact with one side surface of the gate electrode layer and the second sidewall layer is in contact with the other side surface of the gate electrode layer; the top surface of the oxide semiconductor layer is depressed from the top surfaces of the source electrode layer and the drain electrode layer; at least a part of the first sidewall layer is provided over the source electrode layer with the gate insulating layer provided therebetween; at least a part of the second sidewall layer is provided over the drain electrode layer with the gate insulating layer provided therebetween; and the first sidewall layer and the second sidewall layer have conductivity.

The semiconductor device with the above structure may include a first impurity region in contact with at least a part of the source electrode layer and a second impurity region in contact with at least a part of the drain electrode layer. In addition, the oxide semiconductor layer preferably has a smaller thickness than the source electrode layer and the drain electrode layer.

The semiconductor device with the above structure may include an insulating layer over the first sidewall layer, the second sidewall layer, and the gate electrode layer; a first wiring layer electrically connected to the source electrode layer through a first opening provided in the insulating layer and the gate insulating layer; and a second wiring layer electrically connected to the drain electrode layer through a second opening provided in the insulating layer and the gate insulating layer.

In the above structure, the insulating layer preferably includes an aluminum oxide layer.

Another embodiment of the present invention is a method for manufacturing a semiconductor device, including the steps of: forming an oxide semiconductor layer; forming an insulating layer in contact with the oxide semiconductor layer; processing the oxide semiconductor layer and the insulating layer into an island-shaped oxide semiconductor layer and an island-shaped channel protection layer; forming a conductive film covering the oxide semiconductor layer and the channel protection layer; removing a region of the conductive film overlapping with the island-shaped oxide semiconductor layer and the channel protection layer by chemical mechanical polishing treatment to form a conductive film having an opening; processing the conductive film having an opening to form a source electrode layer and a drain electrode layer; forming a gate insulating layer over the channel protection layer, the source electrode layer, and the drain electrode layer; forming a gate electrode layer overlapping with the island-shaped oxide semiconductor layer with the channel protection layer and the gate insulating layer provided therebetween; and forming a first sidewall layer overlapping with the source electrode layer and a second sidewall layer overlapping with the drain electrode layer to be in contact with side surfaces of the gate electrode layer.

Another embodiment of the present invention is a method for manufacturing a semiconductor device, including the steps of: forming an oxide semiconductor layer; forming an insulating layer in contact with the oxide semiconductor layer; processing the oxide semiconductor layer and the insulating layer into an island-shaped oxide semiconductor layer and an island-shaped channel protection layer; forming a conductive film covering the oxide semiconductor layer and the channel protection layer; removing a region of the conductive film overlapping with the island-shaped oxide semiconductor layer and the channel protection layer by chemical mechanical polishing treatment to form a conductive film having an opening; processing the conductive film having an opening to form a source electrode layer and a drain electrode layer; removing the channel protection layer; forming a gate insulating layer over the island-shaped oxide semiconductor layer, the source electrode layer, and the drain electrode layer; forming a gate electrode layer overlapping with the oxide semiconductor layer with the channel protection layer and the gate insulating layer provided therebetween; and forming a first sidewall layer overlapping with the source electrode layer and a second sidewall layer overlapping with the drain electrode layer to be in contact with side surfaces of the gate electrode layer.

Note that the oxide semiconductor is in a single crystal state, a polycrystalline (also referred to as polycrystal) state, an amorphous state, or the like.

In the case of an oxide semiconductor in an amorphous state, a flat surface can be obtained with relative ease, so that interface scattering of carriers (electrons) of a transistor including such an oxide semiconductor at the time of operation can be reduced, and relatively high field-effect mobility can be obtained with relative ease.

In an oxide semiconductor having crystallinity, defects in the bulk can be reduced and when the surface flatness of the oxide semiconductor is improved, field-effect mobility of a transistor including the oxide semiconductor having crystallinity can be higher than that of a transistor including an oxide semiconductor in an amorphous state. In order to improve the surface flatness, the oxide semiconductor is preferably formed over a flat surface. Specifically, the oxide semiconductor can be formed over a surface with the average surface roughness (Ra) of less than or equal to 0.15 nm, preferably less than or equal to 0.1 nm.

Note that an average surface roughness Ra is obtained by expanding arithmetic mean surface roughness, which is defined by JIS B0601: 2001 (ISO4287: 1997), into three dimensions so as to be applicable to a curved surface. Moreover, an average surface roughness Ra can be expressed as "the average value of the absolute values of deviations from a reference surface to a specific surface" and is defined by the following formula 1.

$$Ra = \frac{1}{S_0} \int_{y_1}^{y_2} \int_{x_1}^{x_2} |f(x, y) - Z_0| dx dy \quad \text{[FORMULA 1]}$$

Here, the specific surface is a surface which is a target of roughness measurement, and is a quadrilateral region which is specified by four points represented by the coordinates $(x_1, y_1, f(x_1, y_1))$, $(x_1, y_2, f(x_1, y_2))$, $(x_2, y_1, f(x_2, y_1))$, and $(x_2, y_2, f(x_2, y_2))$. The area of a rectangle which is obtained by projecting the specific surface on the xy plane is represented by $S_0$, and the height of the reference surface (the average height of the specific surface) is represented by $Z_0$. The average surface roughness Ra can be measured using an atomic force microscope (AFM).

In the cross section of a semiconductor device of one embodiment of the present invention in the channel length direction, one side surface of an oxide semiconductor layer is in contact with a source electrode layer; the other side surface of the oxide semiconductor layer is in contact with a drain electrode layer; and a sidewall layer made of a conductive material is provided over the source electrode layer or the drain electrode layer with a gate insulating layer provided therebetween. Since the sidewall layer made of the conductive material overlaps with the source electrode layer or the drain electrode layer with the gate insulating layer provided therebetween, the transistor substantially having an Lov region can be formed, whereby a reduction in on-state current can be suppressed.

A semiconductor device of one embodiment of the present invention includes a source electrode layer and a drain electrode layer formed in the following manner: an oxide semiconductor layer and a channel protection layer are formed; a conductive film is formed; and a region of the conductive film which overlaps with the oxide semiconductor layer and the channel protection layer is removed by chemical mechanical polishing treatment. Precise processing can be performed accurately because an etching step using a resist mask is not performed in the step of removing the conductive film for forming the source electrode layer and the drain electrode layer. The channel protection layer is formed over the oxide semiconductor layer when the chemical mechanical polishing treatment is performed. With the channel protection layer, damage to the oxide semiconductor layer or a reduction in film thickness can be suppressed. Thus, in the process for manufacturing a semiconductor device, transistors having a minute structure and small variations in shapes and characteristics can be manufactured with a high yield.

According to one embodiment of the present invention, a semiconductor device which is miniaturized while maintaining favorable characteristics can be provided.

DETAILED DESCRIPTION OF THE INVENTION

Figure 1A:
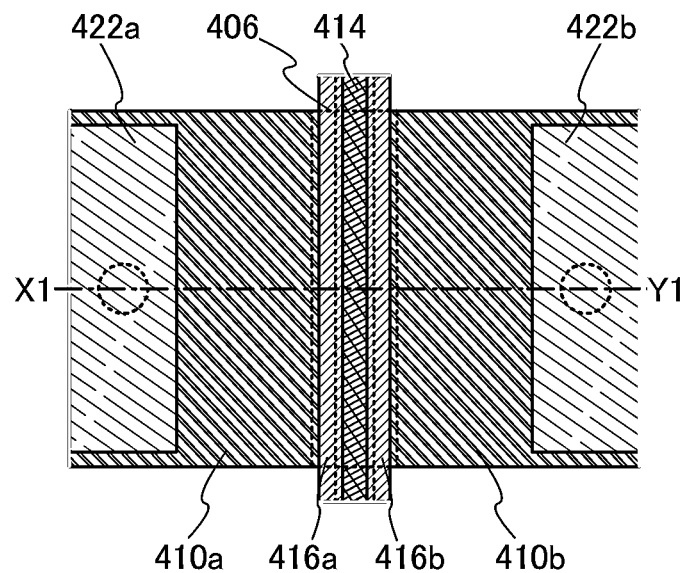
FIGS. 1A and 1B are a plan view and a cross-sectional view of one embodiment of a semiconductor device.

Embodiments of the present invention are described below with reference to the accompanying drawings. However, the present invention is not limited to the following description, and it will be easily understood by those skilled in the art that modes and details can be variously changed without departing from the spirit and scope of the invention. Therefore, the present invention is not construed as being limited to the following description of the embodiments.

Note that in structures of the present invention described below, the same portions or portions having similar functions are denoted by the same reference numerals in different drawings, and description thereof is not repeated. Further, the same hatching pattern is applied to portions having similar functions, and the portions are not especially denoted by reference numerals in some cases.

Note that the position, size, range, or the like of each structure illustrated in drawings and the like is not accurately represented in some cases for easy understanding. Therefore, the disclosed invention is not necessarily limited to the position, size, range, or the like disclosed in the drawings and the like.

Note that the ordinal numbers such as "first" and "second" in this specification and the like are used for convenience and do not denote the order of steps and the stacking order of layers. The ordinal numbers in this specification and the like do not denote particular names which specify the invention.

Functions of a "source" and a "drain" are sometimes replaced with each other when a transistor of opposite polarity is used or when the direction of current flowing is changed in circuit operation, for example. Therefore, the terms "source" and "drain" can be replaced with each other in this specification and the like.

(Embodiment 1)

In this embodiment, one embodiment of a semiconductor device and a method for manufacturing the semiconductor device will be described with reference to FIGS. 1A and 1B, FIGS. 2A to 2D, and FIGS. 3A to 3D.

<Example of Structure of Semiconductor Device>

Figure 1B:
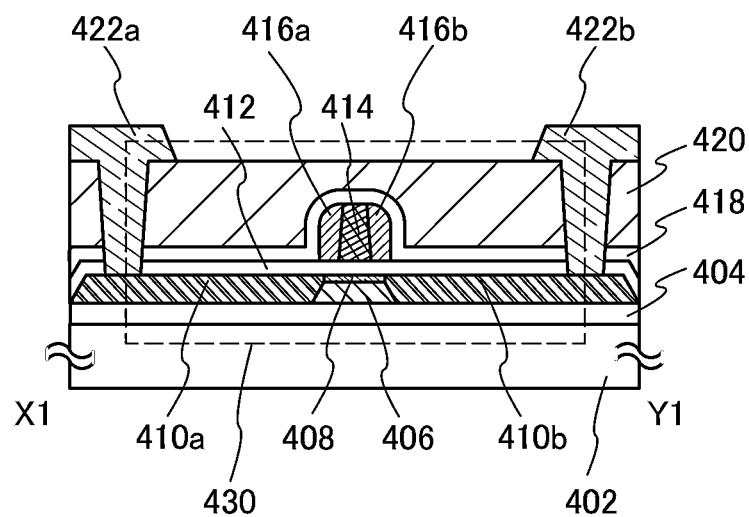

FIGS. 1A and 1B are a plan view and a cross-sectional view illustrating a transistor 430 as an example of a semiconductor device. FIG. 1A is a plan view of the transistor 430, and FIG. 1B is a cross-sectional view taken along the line X1-Y1 in FIG. 1A. Note that in FIG. 1A, some components of the transistor 430 (e.g., an insulating layer 420) are not illustrated for simplicity.

The transistor 430 illustrated in FIGS. 1A and 1B includes, over a substrate 402, a base insulating layer 404; a source electrode layer 410a; a drain electrode layer 410b; an oxide semiconductor layer 406 of which one side surface is in contact with the source electrode layer 410a and the other side surface is in contact with the drain electrode layer 410b in the cross section in the channel length direction; a channel protection layer 408 in contact with a top surface of the oxide semiconductor layer 406; a gate insulating layer 412 in contact with top surfaces of the channel protection layer 408, the source electrode layer 410a, and the drain electrode layer 410b; a gate electrode layer 414 provided in a region overlapping with the oxide semiconductor layer 406 with the channel protection layer 408 and the gate insulating layer 412 provided therebetween; and a first sidewall layer 416a in contact with one side surface of the gate electrode layer 414 and a second sidewall layer 416b in contact with the other side surface of the gate electrode layer 414 in the cross section in the channel length direction.

Since the channel protection layer 408 is provided over the oxide semiconductor layer 406 as illustrated in FIG. 1B, the oxide semiconductor layer 406 has a smaller thickness than the source electrode layer 410a and the drain electrode layer 410b.

In the manufacturing process, the channel protection layer 408 has the function of protecting the oxide semiconductor layer 406. In addition, the channel protection layer 408 has the function as part of the gate insulating layer of the transistor 430. With such a structure, damage to the oxide semiconductor layer 406 or a reduction in film thickness can be suppressed in the manufacturing process, thereby providing the transistor 430 with a high yield.

In the transistor 430, at least part of the sidewall layer 416a is over the source electrode layer 410a with the gate insulating layer 412 provided therebetween. At least part of the sidewall layer 416b is over the drain electrode layer 410b with the gate insulating layer 412 provided therebetween. The sidewall layer 416a and the sidewall layer 416b are formed with a semiconductor material or a conductive material and have conductivity. Therefore, the sidewall layer 416a and the sidewall layer 416b can serve as part of the gate electrode layer 414, and thus a region in which the sidewall layer overlaps with the source electrode layer 410a or the drain electrode layer 410b with the gate insulating layer 412 provided therebetween can be substantially an Lov region.

In the case where the width of an Lov region is large, there is a possibility that the parasitic capacitance caused in the region may become large. In this embodiment, however, since the sidewall layers 416a and 416b having conductivity are formed in a self-aligned manner to be in contact with the gate electrode layer 414, a minute Lov region can be formed accurately.

The transistor 430 illustrated in FIGS. 1A and 1B may further include an insulating layer 418 and the insulating layer 420 which are provided over the sidewall layer 416a, the sidewall layer 416b, and the gate electrode layer 414, and a wiring layer 422a and a wiring layer 422b which are provided over the insulating layer 420. Through openings formed in the insulating layer 418, the insulating layer 420, and the gate insulating layer 412, the wiring layer 422a is electrically connected to the source electrode layer 410a, and the wiring layer 422b is electrically connected to the drain electrode layer 410b. Note that the two-layer structure of the insulating layer 418 and the insulating layer 420 is employed in this embodiment, but the present invention is not limited thereto. Alternatively, a layered structure of three or more layers may be employed.

The side surfaces of the oxide semiconductor layer 406, which are in contact with the source electrode layer 410a and the drain electrode layer 410b, are preferably tapered as illustrated in FIG. 1B. The taper angle can be, for example, greater than or equal to 20° and less than or equal to 50°. Note that here, the taper angle refers to an inclined angle formed by the side surface and the bottom surface of the oxide semiconductor layer 406 when the oxide semiconductor layer 406 is seen from the direction vertical to the cross section.

Since the side surface of the oxide semiconductor layer 406 is tapered, a conductive film to be the source electrode layer 410a and the drain electrode layer 410b can be formed with good coverage. In addition, the tapered shape of the side surface of the oxide semiconductor layer 406 can suppress oxygen vacancy caused by oxygen released from the side surface of the oxide semiconductor layer 406, thereby reducing leakage current of the transistor 430.

Furthermore, with the tapered side surface of the oxide semiconductor layer 406, a contact area between the oxide semiconductor layer 406 and the source electrode layer 410a or the drain electrode layer 410b can be increased, thereby reducing contact resistance. When the side surfaces of the oxide semiconductor layer 406 are tapered, a side surface of the source electrode layer 410a and a side surface of the drain electrode layer 410b are inversely tapered. With the oxide semiconductor layer 406, the source electrode layer 410a, and the drain electrode layer 410b which have the above-mentioned shapes, when an electric field is applied between a source and a drain, concentration of the electric field on the oxide semiconductor layer 406 can be relieved.

In the case where the transistor 430 is not provided with a sidewall layer having conductivity, formation of the Lov region needs precise alignment of an oxide semiconductor layer and a gate electrode layer each of which has a small line width. In the transistor 430 of this embodiment, however, since the sidewall layers 416a and 416b having conductivity are provided on the side surfaces of the gate electrode layer 414 in the cross section in the channel length direction, a region in which the sidewall layer 416a overlaps with the source electrode layer 410a and a region in which the sidewall layer 416b overlaps with the drain electrode layer 410b can be substantially Lov regions. Therefore, the degree of freedom in alignment for forming an Lov region can be improved, whereby the transistor 430 in which a decrease in on-state current is suppressed can be provided with a high yield.

In addition, in the case where the length of the island-shaped oxide semiconductor layer 406 in the channel length direction is larger than that of the gate electrode layer 414 in the channel length direction, the degree of freedom in alignment for forming the gate electrode layer 401 can be further improved.

The oxide semiconductor layer 406 is preferably a CAAC-OS (c-axis aligned crystalline oxide semiconductor) film.

The CAAC-OS film is not completely single crystal nor completely amorphous. The CAAC-OS film is an oxide semiconductor layer with a crystal-amorphous mixed phase structure where crystal parts are included in an amorphous phase. Note that, in most cases, the crystal part fits inside a cube whose one side is less than 100 nm. From an observation image obtained with a transmission electron microscope (TEM), a boundary between an amorphous part and a crystal part in the CAAC-OS film is not clear. Further, with the TEM, a grain boundary in the CAAC-OS film is not found. Thus, in the CAAC-OS film, a decrease in electron mobility, due to the grain boundary, is suppressed.

In each of the crystal parts included in the CAAC-OS film, a c-axis is aligned in a direction parallel to a normal vector of a surface where the CAAC-OS film is formed or a normal vector of a surface of the CAAC-OS film, a triangular or hexagonal atomic arrangement which is seen from the direction perpendicular to the a-b plane is formed, and metal atoms are arranged in a layered manner or metal atoms and oxygen atoms are arranged in a layered manner when seen from the direction perpendicular to the c-axis. Note that, among crystal parts, the directions of the a-axis and the b-axis of one crystal part may be different from those of another crystal part. In this specification, a simple term "perpendicular" includes a range from 85° to 95°. In addition, a simple term "parallel" includes a range from −5° to 5°.

In the CAAC-OS film, distribution of crystal parts is not necessarily uniform. For example, in the formation process of the CAAC-OS film, in the case where crystal growth occurs from a surface side of the oxide semiconductor layer, the proportion of crystal parts in the vicinity of the surface of the oxide semiconductor film is higher than that in the vicinity of the surface where the oxide semiconductor film is formed in some cases. Further, when an impurity is added to the CAAC-OS film, the crystal part in a region to which the impurity is added becomes amorphous in some cases.

Since the c-axes of the crystal parts included in the CAAC-OS film are aligned in the direction parallel to a normal vector of a surface where the CAAC-OS film is formed or a normal vector of a surface of the CAAC-OS film, the directions of the c-axes may be different from each other depending on the shape of the CAAC-OS film (the cross-sectional shape of the surface where the CAAC-OS film is formed or the cross-sectional shape of the surface of the CAAC-OS film). Note that, when the CAAC-OS film is formed, the direction of the c-axis of the crystal part is the direction parallel to a normal vector of the surface where the CAAC-OS film is formed or a normal vector of the surface of the CAAC-OS film. The crystal part is formed by film formation or by performing treatment for crystallization such as heat treatment after film formation.

With the use of the CAAC-OS film in a transistor, a change in electric characteristics of the transistor due to irradiation with visible light or ultraviolet light can be suppressed. Thus, the transistor has high reliability.

Note that for the details of the other components of the transistor, refer to the following description of a method for manufacturing the transistor 430 using FIGS. 2A to 2D and FIGS. 3A to 3D.

<Example of Process for Manufacturing Transistor 430>

An example of a process for manufacturing the transistor 430 described in this embodiment will be described below with reference to FIGS. 2A to 2D and FIGS. 3A to 3D.

First, the base insulating layer 404 is formed over the substrate 402.

There is no particular limitation on a substrate that can be used as the substrate 402 as long as it has at least heat resistance to withstand a subsequent heat treatment step. For example, a glass substrate of barium borosilicate glass, aluminoborosilicate glass, or the like, a ceramic substrate, a quartz substrate, or a sapphire substrate can be used. A single crystal semiconductor substrate or a polycrystalline semiconductor substrate of silicon, silicon carbide, or the like; a compound semiconductor substrate of silicon germanium or the like; an SOI substrate; or the like can be used as the substrate 402. Alternatively, any of these substrates over which a semiconductor element is provided can be used as the substrate 402.

The semiconductor device may be manufactured with the use of a flexible substrate as the substrate 402. In the case of manufacturing a semiconductor device including a flexible substrate, a transistor 430 including the oxide semiconductor layer 406 may be directly formed on the flexible substrate, or the transistor 430 including the oxide semiconductor layer 406 may be formed over a different manufacturing substrate and then separated and transferred to the flexible substrate. Note that in order to separate the transistor from the manufacturing substrate and transfer it to the flexible substrate, a separation layer may be provided between the manufacturing substrate and the transistor 430 including the oxide semiconductor layer.

The base insulating layer 404 can have a single-layer structure or a layered structure including one or more films selected from films containing silicon oxide, silicon nitride, silicon oxynitride, silicon nitride oxide, aluminum oxide, aluminum nitride, aluminum oxynitride, aluminum nitride oxide, hafnium oxide, gallium oxide, and a mixed material of any of these materials. It is preferable that the base insulating layer 404 have a single-layer structure or a layered structure including an oxide insulating film and the oxide insulating film be in contact with the oxide semiconductor layer 406 to be formed later. The base insulating layer 404 can be formed by a sputtering method or a PE-CVD method, for example. Note that the base insulating layer 404 is not necessarily provided.

The base insulating layer 404 preferably includes a region where the oxygen content is higher than that in the stoichiometric composition (hereinafter also referred to as oxygen-excess region), in which case oxygen vacancy in the oxide semiconductor layer 406 to be formed later can be filled with the excess oxygen contained in the base insulating layer 404. In the case of having a layered structure, the base insulating layer 404 preferably includes an oxygen-excess region at least in a layer in contact with the oxide semiconductor layer 406. In order to provide the oxygen-excess region in the base insulating layer 404, for example, the base insulating layer 404 may be formed in an oxygen atmosphere. Alternatively, the oxygen-excess region may be formed by adding oxygen (including at least one of an oxygen radical, an oxygen atom, and an oxygen ion) to the base insulating layer 404 after its formation. Oxygen can be added by an ion implantation method, an ion doping method, a plasma immersion ion implantation method, plasma treatment, or the like.

Figure 2A:
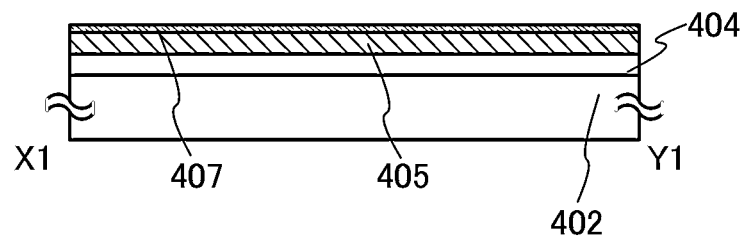
FIGS. 2A to 2D illustrate an example of a method for manufacturing a semiconductor device.

Next, an oxide semiconductor layer 405 and a protection layer 407 are formed over the base insulating layer 404 (see FIG. 2A). The oxide semiconductor layer 405 and the protection layer 407 are preferably formed successively in a vacuum. The successive formation of the oxide semiconductor layer 405 and the protection layer 407 in a vacuum is preferable because it can reduce impurities at an interface between the oxide semiconductor layer 405 and the protection layer 407.

The oxide semiconductor layer 405 has a thickness of, for example, 3 nm to 30 nm, preferably 5 nm to 20 nm. The protection layer 407 has a thickness of, for example, 3 nm to 40 nm, preferably 5 nm to 20 nm.

There is no particular limitation on a material that can be used for the protection layer 407 as long as a material having an insulating property. For example, a material such as silicon oxide, gallium oxide, aluminum oxide, silicon nitride, silicon oxynitride, aluminum oxynitride, or silicon nitride oxide can be used. As the material that can be used for the protection layer 407, a material which is not eliminated by the CMP treatment for forming the source electrode layer and the drain electrode layer can be selected by a practitioner as appropriate.

Figure 2B:
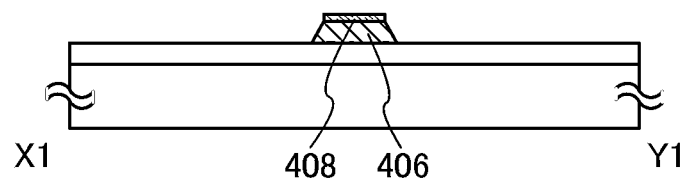

Next, the oxide semiconductor layer 405 and the protection layer 407 are processed into the island-shaped oxide semiconductor layer 406 and the island-shaped channel protection layer 408 by a photolithography process and an etching step (see FIG. 2B). Here, as a mask used for processing into the island-shaped oxide semiconductor layer 406 and the island-shaped channel protection layer 408, it is preferable to use a mask having a finer pattern obtained by performing a slimming process on a mask formed by a photolithography method or the like. As the slimming process, an ashing process in which oxygen in a radical state (an oxygen radical) or the like is used can be employed, for example. The oxide semiconductor layer 405 is etched while the ashing process is performed on the mask, so that the oxide semiconductor layer 406 whose side surface is tapered can be formed. However, the slimming process is not limited to the ashing process as long as the mask formed by a photolithography method or the like can be processed into a finer pattern. Note that the channel length (L) of a transistor is determined by the mask formed by the slimming process. Therefore, a process with high controllability can be employed as the slimming process.

As a result of the slimming process, the line width of the mask formed by a photolithography method or the like can be reduced to a length shorter than or equal to the resolution limit of a light exposure apparatus, preferably less than or equal to half of the resolution limit of the light exposure apparatus, more preferably less than or equal to one third of the resolution limit of the light exposure apparatus. For example, the line width can be greater than or equal to 20 nm and less than or equal to 2000 nm, preferably greater than or equal to 50 nm and less than or equal to 350 nm. This enables further miniaturization of the transistor.

Although there is no particular limitation on a method for forming the island-shaped oxide semiconductor layer 406 and the island-shaped channel protection layer 408, it is preferable to etch the oxide semiconductor layer 406 and the channel protection layer 408 collectively by a dry etching method because it can shorten the manufacturing process.

In this embodiment, the channel protection layer 408 also has the function as a gate insulating layer. Therefore, an insulating film with high film density is formed. For example, a silicon oxide film formed by a sputtering method or a CVD method can be used as the channel protection layer 408. The channel protection layer 408 preferably includes an oxygen-excess region, in which case oxygen vacancy in the oxide semiconductor layer 406 can be filled with excess oxygen contained in the channel protection layer 408.

The oxide semiconductor layer 405 may have either a single-layer structure or a layered structure. Further, the oxide semiconductor layer 405 may have either an amorphous structure or a crystalline structure. In the case where the oxide semiconductor layer 405 has an amorphous structure, heat treatment may be performed on the oxide semiconductor layer 405 in a subsequent manufacturing step so that the oxide semiconductor layer has crystallinity. The heat treatment for crystallizing the amorphous oxide semiconductor layer is performed at a temperature higher than or equal to 250° C. and lower than or equal to 700° C., preferably higher than or equal to 400° C., more preferably higher than or equal to 500° C., much more preferably higher than or equal to 550° C. Note that the heat treatment can also serve as another heat treatment in the manufacturing process.

The oxide semiconductor layer 405 can be formed by a sputtering method, a molecular beam epitaxy (MBE) method, a CVD method, a pulse laser deposition method, an atomic layer deposition (ALD) method, or the like as appropriate. The oxide semiconductor layer 406 may be formed with a sputtering apparatus which performs deposition in the state where top surfaces of a plurality of substrates are substantially perpendicular to a top surface of a sputtering target.

In the formation of the oxide semiconductor layer 405, the concentration of hydrogen contained in the oxide semiconductor layer 405 is preferably reduced as much as possible. In order to reduce the hydrogen concentration, for example, in the case where the oxide semiconductor layer 405 is formed by a sputtering method, a rare gas (typically, argon), an oxygen gas, and a mixed gas of a rare gas and an oxygen gas, which are high-purity gases and from which impurities such as hydrogen, water, a hydroxyl group, and hydride are removed, are used as appropriate as a gas supplied to a deposition chamber of a sputtering apparatus.

The oxide semiconductor layer is deposited in such a manner that a sputtering gas from which hydrogen and moisture have been removed is introduced into the deposition chamber while moisture remaining therein is removed, whereby the hydrogen concentration in the deposited oxide semiconductor layer 406 can be reduced. In order to remove moisture remaining in the deposition chamber, an entrapment vacuum pump such as a cryopump, an ion pump, or a titanium sublimation pump is preferably used. A turbo molecular pump to which a cold trap is added may be used. The deposition chamber which is evacuated with a cryopump has a high capability in removing a compound containing a hydrogen atom, such as a hydrogen molecule and water ($H_2O$) (preferably, also a compound containing a carbon atom), and the like; therefore, the concentration of an impurity contained in the oxide semiconductor layer 405 deposited in the deposition chamber can be reduced.

In the case where the oxide semiconductor layer 406 is formed by a sputtering method, the relative density (fill rate) of a metal oxide target that is used for the deposition is greater than or equal to 90% and less than or equal to 100%, preferably greater than or equal to 95% and less than or equal to 99.9%. With the use of a metal oxide target with a high relative density, the oxide semiconductor layer 405 can be dense.

In order to reduce the impurity concentration in the oxide semiconductor layer 405, it is also effective to form the oxide semiconductor layer 405 while the substrate 402 is kept at high temperature. The heating temperature of the substrate 402 is higher than or equal to 150° C. and lower than or equal to 450° C., and preferably the substrate temperature is higher than or equal to 200° C. and lower than or equal to 350° C. A crystalline oxide semiconductor layer can be formed by heating the substrate at a high temperature in the formation.

An oxide semiconductor used for the oxide semiconductor layer 405 preferably contains at least indium (In) or zinc (Zn). In particular, both In and Zn are preferably contained. As a stabilizer for reducing variations in electric characteristics of transistors including the oxide semiconductor layer, it is preferable that gallium (Ga) be additionally contained. Tin (Sn) is preferably contained as a stabilizer. Hafnium (Hf) is preferably contained as a stabilizer. Aluminum (Al) is preferably contained as a stabilizer. Zirconium (Zr) is preferably contained as a stabilizer.

As another stabilizer, one or plural kinds of lanthanoid such as lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), and lutetium (Lu) may be contained.

As the oxide semiconductor, for example, indium oxide, tin oxide, zinc oxide, a two-component metal oxide such as an In—Zn-based oxide, a Sn—Zn-based oxide, an Al—Zn-based oxide, a Zn—Mg-based oxide, a Sn—Mg-based oxide, an In—Mg-based oxide, or an In—Ga-based oxide, a three-component metal oxide such as an In—Ga—Zn-based oxide (also referred to as IGZO), an In—Al—Zn-based oxide, an In—Sn—Zn-based oxide, a Sn—Ga—Zn-based oxide, an Al—Ga—Zn-based oxide, a Sn—Al—Zn-based oxide, an In—Hf—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, or an In—Lu—Zn-based oxide, or a four-component metal oxide such as an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, or an In—Hf—Al—Zn-based oxide can be used.

Note that here, for example, an "In—Ga—Zn-based oxide" means an oxide containing In, Ga, and Zn as its main component and there is no particular limitation on the ratio of In:Ga:Zn. The In—Ga—Zn-based oxide may contain a metal element other than In, Ga, and Zn.

Alternatively, a material represented by $InMO_3(ZnO)_m$ (m>0, and m is not an integer) may be used as the oxide semiconductor. Note that M represents one or more metal elements selected from Ga, Fe, Mn, and Co. Further alternatively, as the oxide semiconductor, a material represented by $In_2SnO_5(ZnO)_n$ (n>0, n is an integer) may be used.

For example, an In—Ga—Zn-based oxide with an atomic ratio of In:Ga:Zn=1:1:1 (=1/3:1/3:1/3), In:Ga:Zn=2:2:1 (=2/5:2/5:1/5), In:Ga:Zn=3:1:2 (=1/2:1/6:1/3), or any of oxides whose composition is in the neighborhood of the above compositions can be used. Alternatively, an In—Sn—Zn-based oxide with an atomic ratio of In:Sn:Zn=1:1:1 (=1/3:1/3:1/3), In:Sn:Zn=2:1:3 (=1/3:1/6:1/2), or In:Sn:Zn=2:1:5 (=1/4:1/8:5/8), or any of oxides whose composition is in the neighborhood of the above compositions may be used.

However, without limitation to the materials given above, a material with an appropriate composition may be used depending on needed semiconductor characteristics (e.g., mobility, threshold voltage, and variation). In order to obtain the required semiconductor characteristics, it is preferable that the carrier concentration, the impurity concentration, the defect density, the atomic ratio between a metal element and oxygen, the interatomic distance, the density, and the like be set to appropriate values.

For example, high mobility can be obtained relatively easily in the case of using an In—Sn—Zn oxide. However, mobility can be increased by reducing the defect density in a bulk in the case of using an In—Ga—Zn-based oxide.

Note that for example, the expression "the composition of an oxide containing In, Ga, and Zn at an atomic ratio of In:Ga:Zn=a:b:c (a+b+c=1), is in the neighborhood of the composition of an oxide containing In, Ga, and Zn at an atomic ratio of In:Ga:Zn=A:B:C (A+B+C=1)" means that a, b, and c satisfy the following relation: $(a-A)^2+(b-B)^2+(c-C)^2 \le r^2$. For example, r may be 0.05. The same applies to other oxides.

It is preferable that a high-purity gas from which an impurity such as hydrogen, water, a hydroxyl group, or a hydride is removed be used as the sputtering gas used for the deposition of the oxide semiconductor layer 405.

There are three methods for obtaining a CAAC-OS film when the CAAC-OS film is used as the oxide semiconductor layer 405. The first method is to deposit the oxide semiconductor layer 405 at a film formation temperature higher than or equal to 200° C. and lower than or equal to 450° C., thereby obtaining c-axis alignment substantially perpendicular to a surface. The second method is to deposit a thin film as the oxide semiconductor layer 405 and the layer is subjected to heat treatment performed at a temperature higher than or equal to 200° C. and lower than or equal to 700° C., thereby obtaining c-axis alignment substantially perpendicular to a surface. The third method is to deposit a first thin oxide semiconductor layer, and the first thin oxide semiconductor layer is subjected to heat treatment performed at a temperature higher than or equal to 200° C. and lower than or equal to 700° C., and then form a second oxide semiconductor layer, thereby obtaining c-axis alignment substantially perpendicular to a surface.

Before the formation of the oxide semiconductor layer 405, planarization treatment may be performed on the surface on which the oxide semiconductor layer 405 is to be formed. The planarization treatment may be, but not particularly limited to, polishing treatment (e.g., chemical mechanical polishing (CMP) treatment), dry etching treatment, or plasma treatment.

As the plasma treatment, reverse sputtering in which an argon gas is introduced and plasma is generated can be performed. The reverse sputtering is a method in which voltage is applied to a substrate side with the use of an RF power source in an argon atmosphere and plasma is generated in the vicinity of the substrate so that a substrate surface is modified. Note that instead of an argon atmosphere, a nitrogen atmosphere, a helium atmosphere, an oxygen atmosphere, or the like may be used. The reverse sputtering can remove particle substances (also referred to as particles or dust) attached to the surface on which the oxide semiconductor layer 405 is to be formed.

As the planarization treatment, polishing treatment, dry etching treatment, or plasma treatment may be performed plural times, or these treatments may be performed in combination. In the case where the treatments are combined, the order of steps may be set as appropriate, without particular limitation, depending on the unevenness of the surface on which the oxide semiconductor layer 405 is to be formed.

Further, the oxide semiconductor layer 405 is preferably subjected to heat treatment for removing excess hydrogen (including water and a hydroxyl group) contained in the oxide semiconductor layer 405 (dehydration or dehydrogenation). The temperature of the heat treatment is higher than or equal to 300° C. and lower than or equal to 700° C., or lower than the strain point of the substrate. The heat treatment can be performed under reduced pressure, a nitrogen atmosphere, or the like.

Hydrogen, which is an impurity imparting n-type conductivity, can be removed from the oxide semiconductor by the heat treatment. For example, the hydrogen concentration in the oxide semiconductor layer 405 after the dehydration or dehydrogenation treatment can be lower than or equal to $5 \times 10^{19}$ atoms/cm$^3$, preferably lower than or equal to $5 \times 10^{18}$ atoms/cm$^3$.

Note that the heat treatment for the dehydration or dehydrogenation may be performed at any timing in the process of manufacturing the transistor 430 as long as it is performed after the formation of the oxide semiconductor layer 405. In the case where an aluminum oxide film is formed as the gate insulating layer 412 or the insulating layer 418, the heat treatment is preferably performed before the aluminum oxide film is formed. The heat treatment for dehydration or dehydrogenation may be performed plural times, and may also serve as another heat treatment.

Note that in the case where the base insulating layer is formed as the base insulating layer 404, the heat treatment for dehydration or dehydrogenation is preferably performed before the oxide semiconductor layer 405 is processed into an island shape, in which case release of oxygen contained in the base insulating layer 404 by the heat treatment can be prevented.

In the heat treatment, it is preferable that water, hydrogen, and the like be not contained in nitrogen or a rare gas such as helium, neon, or argon. The purity of nitrogen or the rare gas such as helium, neon, or argon which is introduced into the heat treatment apparatus is set to preferably higher than or equal to 6N (99.9999%), more preferably hither than or equal to 7N (99.99999%) (i.e., the impurity concentration is preferably lower than or equal to 1 ppm, more preferably lower than or equal to 0.1 ppm).

In addition, after the oxide semiconductor layer 405 is heated by the heat treatment, a high-purity oxygen gas, a high-purity dinitrogen monoxide gas, or ultra dry air (the moisture amount is less than or equal to 20 ppm (−55° C. by conversion into a dew point), preferably less than or equal to 1 ppm, more preferably less than or equal to 10 ppb, in the measurement with the use of a dew point meter of a cavity ring down laser spectroscopy (CRDS) system) may be introduced into the same furnace while the heating temperature is being maintained or being gradually decreased. It is preferable that water, hydrogen, or the like be not contained in the oxygen gas or the dinitrogen monoxide gas. The purity of the oxygen gas or the dinitrogen monoxide gas which is introduced into the heat treatment apparatus is preferably higher than or equal to 6N, more preferably higher than or equal to 7N (i.e., the impurity concentration in the oxygen gas or the dinitrogen monoxide gas is preferably lower than or equal to 1 ppm, more preferably lower than or equal to 0.1 ppm). The oxygen gas or the dinitrogen monoxide gas acts to supply oxygen that is a main component of the oxide semiconductor and that is reduced by the step of removing an impurity for the dehydration or dehydrogenation, so that the oxide semiconductor layer 406 can be a high-purity and electrically i-type (intrinsic) oxide semiconductor layer.

Further or alternatively, oxygen (which includes at least one of an oxygen radical, an oxygen atom, and an oxygen ion) may be added to the oxide semiconductor layer after being subjected to the dehydration or dehydrogenation treatment to supply oxygen to the oxide semiconductor layer.

By addition of oxygen to the dehydrated or dehydrogenated oxide semiconductor layer to supply oxygen to the film, the oxide semiconductor layer can be highly purified and an i-type (intrinsic). Variations in electric characteristics of a transistor including the oxide semiconductor layer which is highly-purified and i-type (intrinsic) is suppressed, and the transistor is electrically stable.

In the step of addition of oxygen to the oxide semiconductor layer, oxygen may be directly added to the oxide semiconductor layer 406 or may be added to the oxide semiconductor layer 406 through the channel protection layer 408 or another film such as the gate insulating layer 412 to be formed later. An ion implantation method, an ion doping method, a plasma immersion ion implantation method, or the like may be employed for the addition of oxygen through another film, whereas plasma treatment or the like can also be employed in addition to the above methods in the case where oxygen is directly added to the exposed oxide semiconductor layer 406.

The addition of oxygen to the oxide semiconductor layer can be performed anytime after the formation of the oxide semiconductor layer. Further, the addition of oxygen to the oxide semiconductor layer may be performed plural times.

Figure 2C:
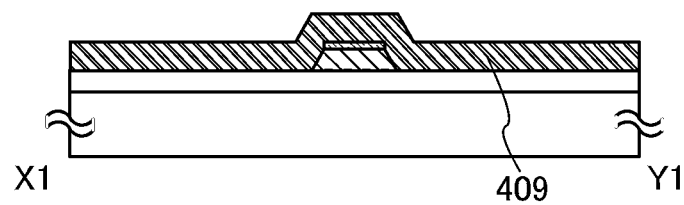
Figure 2D:
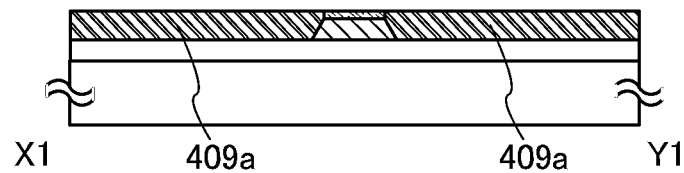

Next, a conductive film 409 to be a source electrode layer and a drain electrode layer (including a wiring formed of the layer the same as the source electrode layer and the drain electrode layer) is formed over the island-shaped oxide semiconductor layer 406 and the channel protection layer 408 (see FIG. 2C).

The conductive film 409 is formed with the use of a material that can withstand heat treatment. For example, a metal film containing an element selected from Al, Cr, Cu, Ta, Ti, Mo, and W, or a metal nitride film containing any of the above elements as its component (e.g., a titanium nitride film, a molybdenum nitride film, or a tungsten nitride film) can be used. Alternatively, a film of a high-melting-point metal such as Ti, Mo, or W or a metal nitride film of any of these elements (e.g., a titanium nitride film, a molybdenum nitride film, or a tungsten nitride film) may be formed over or/and below the metal film such as an Al film or a Cu film. Alternatively, the conductive film 409 may be formed with the use of conductive metal oxide. Examples of the conductive metal oxide are indium oxide ($In_2O_3$), tin oxide ($SnO_2$), zinc oxide (ZnO), indium oxide-tin oxide ($In_2O_3$—$SnO_2$, abbreviated to ITO), indium oxide-zinc oxide ($In_2O_3$—ZnO), and any of these metal oxide materials containing silicon oxide.

Next, polishing (cutting, grinding) treatment is performed on the conductive film 409 to remove part of the conductive film 409 so that the channel protection layer 408 is exposed. By this polishing treatment, a region of the conductive film 409 which overlaps with the oxide semiconductor layer 406 and the channel protection layer 408 is removed, so that a conductive film 409a having an opening in the region is formed (see FIG. 2D).

As the polishing (cutting, grinding) method, chemical mechanical polishing (CMP) treatment can be used favorably. In this embodiment, the region of the conductive film 409 which overlaps with the oxide semiconductor layer 406 and the channel protection layer 408 is removed by CMP treatment.

Note that the CMP treatment may be performed only once or plural times. When the CMP treatment is performed plural times, first polishing is preferably performed with a high polishing rate followed by final polishing with a low polishing rate. By performing polishing steps with different polishing rates in combination, the planarity of the polished surface can be further improved.

Note that in this embodiment, the CMP treatment is used for removing the region of the conductive film 409 which overlaps with the oxide semiconductor layer 406 and the channel protection layer 408; however, another polishing (grinding or cutting) treatment may be used. Alternatively, the polishing treatment such as CMP treatment may be combined with etching (dry etching or wet etching) treatment, plasma treatment, or the like. For example, after the CMP treatment, dry etching treatment or plasma treatment (e.g., reverse sputtering) may be performed to improve the planarity of the surface to be processed. In the case where the polishing treatment is combined with etching treatment, plasma treatment, or the like, the order of the steps is not particularly limited, and may be set as appropriate depending on the material, thickness, and roughness of the surface of the conductive film 409.

In this embodiment, a top edge of the conductive film 409a and a top edge of the channel protection layer 408 are substantially aligned. Note that the shape of the conductive film 409a (or the shape of the source electrode layer 410a and the drain electrode layer 410b which are obtained by processing the conductive film 409a) differs depending on conditions of the polishing treatment for removing the conductive film 409. For example, the conductive film 409a may be reduced from the surface of the channel protection layer 408 in the thickness direction.

Figure 3A:
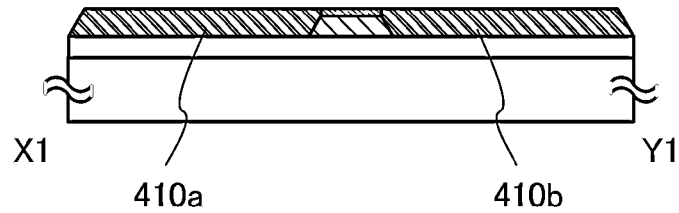
FIGS. 3A to 3D illustrate the example of the method for manufacturing a semiconductor device.

Next, the conductive film 409a is processed into the source electrode layer 410a and the drain electrode layer 410b (including a wiring formed of the layer the same as the source electrode layer and the drain electrode layer) by a photolithography process (see FIG. 3A).

Since the channel protection layer 408 is provided over the oxide semiconductor layer 406 asn illustrated in FIG. 3A, the oxide semiconductor layer 406 has a smaller thickness than the source electrode layer 410a and the drain electrode layer 410b.

Note that the thickness of each of the source electrode layer 410a and the drain electrode layer 410b is 3 nm to 30 nm, preferably 5 nm to 20 nm, for example.

In this embodiment, a method in which the conductive film 409 is formed, the region of the conductive film 409 which overlaps with the oxide semiconductor layer 406 and the channel protection layer 408 is removed by polishing treatment, and selective etching is performed to form the source electrode layer 410a and the drain electrode layer 410b is described; however, embodiments of the present invention are not limited thereto. A method in which the conductive film 409 is selectively etched, and after that the region of the conductive film 409 which overlaps with the oxide semiconductor layer 406 and the channel protection layer 408 is removed by polishing treatment to form the source electrode layer 410a and the drain electrode layer 410b may be employed. Note that in the case where etching treatment is performed before the polishing treatment, the region of the conductive film 409 which overlaps with the oxide semiconductor layer 406 and the channel protection layer 408 is not removed by the etching treatment.

In the method for manufacturing a transistor described in this embodiment, when the source electrode layer 410a and the drain electrode layer 410b are formed, etching treatment using a resist mask is not performed at the step of removing the region of the conductive film 409 which overlaps with the oxide semiconductor layer 406 and the channel protection layer 408. For this reason, even when the width of the source electrode layer 410a and the drain electrode layer 410b in the channel length direction is small, precise processing can be performed accurately. Thus, in the process for manufacturing a semiconductor device, the transistors having a minute structure and small variations in shapes and characteristics can be manufactured with a high yield.

Figure 3B:
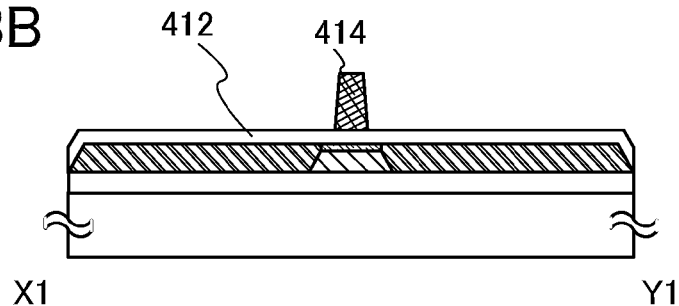

Next, the gate insulating layer 412 is formed over the oxide semiconductor layer 406, the channel protection layer 408, the source electrode layer 410a, and the drain electrode layer 410b (see FIG. 3B).

The gate insulating layer 412 can be formed to have a thickness larger than or equal to 1 nm and smaller than or equal to 20 nm by a sputtering method, an MBE method, a CVD method, a pulse laser deposition method, an ALD method, or the like as appropriate. The gate insulating layer 412 may be formed with a sputtering apparatus which performs deposition in the state where top surfaces of a plurality of substrates are substantially perpendicular to a top surface of a sputtering target.

Note that a short-channel effect becomes significant as the gate insulating layer 412 is thicker. For example, in the case of an n-channel transistor, the threshold voltage tends to shift negatively. In the method for manufacturing a transistor in this embodiment, however, the top surfaces of the channel protection layer 408, the source electrode layer 410a, and the drain electrode layer 410b are planarized by polishing treatment. Therefore, the gate insulating layer 412 can be formed to be thin with good coverage.

Examples of a material for the gate insulating layer 412 include silicon oxide, gallium oxide, aluminum oxide, silicon nitride, silicon oxynitride, aluminum oxynitride, and silicon nitride oxide. It is preferable that the gate insulating layer 412 include oxygen in a portion which is in contact with the oxide semiconductor layer 406. In particular, it is preferable that the oxygen content of the gate insulating layer 412 in (a bulk of) the film be in excess of that in the stoichiometric composition. For example, in the case where a silicon oxide film is used as the gate insulating layer 412, the composition formula thereof is preferably $SiO_{2+\alpha}$ ($\alpha>0$). In this embodiment, a silicon oxide film of $SiO_{2+\alpha}$ ($\alpha>0$) is used as the gate insulating layer 412. By using the silicon oxide film as the gate insulating layer 412, oxygen can be supplied to the oxide semiconductor layer 406, leading to favorable characteristics. Further, the gate insulating layer 412 is preferably formed in consideration of the size of a transistor to be formed and the step coverage with the gate insulating layer 412.

In the case where the gate insulating layer 412 is formed using a high-k material such as hafnium oxide, yttrium oxide, hafnium silicate ($HfSiO_xO_y$ ($x>0$, $y>0$)), hafnium silicate to which nitrogen is added ($HfSiO_xN_y$ ($x>0$, $y>0$)), hafnium aluminate ($HfAl_xO_y$ ($x>0$, $y>0$)), or lanthanum oxide, gate leakage current can be reduced. Further, the gate insulating layer 412 may have either a single-layer structure or a layered structure.

The gate insulating layer 412 preferably includes an oxygen-excess region like the base insulating layer 404 and the channel protection layer 408, in which case oxygen vacancy in the oxide semiconductor layer 406 can be filled with the excess oxygen contained in the gate insulating layer 412. In the case where the gate insulating layer 412 has a layered structure, the gate insulating layer 412 preferably includes an oxygen-excess region at least in a layer in contact with the channel protection layer 408. In order to provide the oxygen-excess region in the gate insulating layer 412, for example, the gate insulating layer 412 may be formed in an oxygen atmosphere. Alternatively, the oxygen-excess region may be formed by adding oxygen (including at least one of an oxygen radical, an oxygen atom, and an oxygen ion) to the gate insulating layer 412 after its formation. Oxygen can be added by an ion implantation method, an ion doping method, a plasma immersion ion implantation method, plasma treatment, or the like.

Note that in the case where oxygen is added to the gate insulating layer 412 after its formation, by the addition of oxygen, oxygen may be also added to the channel protection layer 408 and the oxide semiconductor layer 406 at the same time. After oxygen is added to the gate insulating layer 412, heat treatment is preferably performed. The heat treatment temperature can be, for example, higher than or equal to 300° C. and lower than or equal to 450° C. Note that the heat treatment can also serve as dehydration or dehydrogenation treatment of the oxide semiconductor layer 406.

Note that the timing of addition of oxygen to the gate insulating layer 412 is not particularly limited as long as it is after the formation of the gate insulating layer 412. A plurality of methods for adding oxygen can be combined. For example, after the formation of the gate insulating layer 412, oxygen may be added by an ion implantation method and plasma treatment, and then heat treatment may be performed. Alternatively, oxygen may be added by plasma treatment after the formation of the gate insulating layer 412, the insulating layer 418 is formed, oxygen may be added again by an ion implantation method, and then heat treatment may be performed. The order of the plasma treatment and the ion implantation treatment may be exchanged.

Next, the gate electrode layer 414 is formed in a region overlapping with the island-shaped oxide semiconductor layer 406 with the channel protection layer 408 and the gate insulating layer 412 provided therebetween (see FIG. 3B).

The gate electrode layer 414 can be formed by a plasma CVD method, a sputtering method, or the like. The gate electrode layer 414 can be formed using a metal film containing an element selected from molybdenum, titanium, tantalum, tungsten, aluminum, copper, chromium, neodymium, and scandium; a metal nitride film containing any of the above elements as its component (e.g., a titanium nitride film, a molybdenum nitride film, or a tungsten nitride film); or the like. Alternatively, a semiconductor film typified by a polycrystalline silicon film doped with an impurity element such as phosphorus, or a silicide film such as a nickel silicide film may be used as the gate electrode layer 414. Further, the gate electrode layer 414 may have either a single-layer structure or a layered structure.

The gate electrode layer 414 can also be formed using a conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added. The gate electrode layer 414 can also have a layered structure of the above conductive material and the above metal material.

As one layer of the gate electrode layer 414 which is in contact with the gate insulating layer 412, a metal oxide containing nitrogen, specifically, an In—Ga—Zn—O film containing nitrogen, an In—Sn—O film containing nitrogen, an In—Ga—O film containing nitrogen, an In—Zn—O film containing nitrogen, a Sn—O film containing nitrogen, an In—O film containing nitrogen, or a metal nitride (e.g., InN or SnN) film can be used. These films each have a work function higher than or equal to 5 eV (electron volt), preferably higher than or equal to 5.5 eV; thus, when these are used as the gate electrode layer, the threshold voltage of the transistor can be shifted to the positive side. Accordingly, a normally-off switching element can be provided.

Note that the gate electrode layer 414 can be formed by processing a conductive film (not illustrated) provided over the gate insulating layer 412 with the use of a mask. Here, as a mask used for the processing, a mask having a finer pattern formed by performing a slimming process on a mask formed by a photolithography method or the like is preferably used.

Figure 3C:
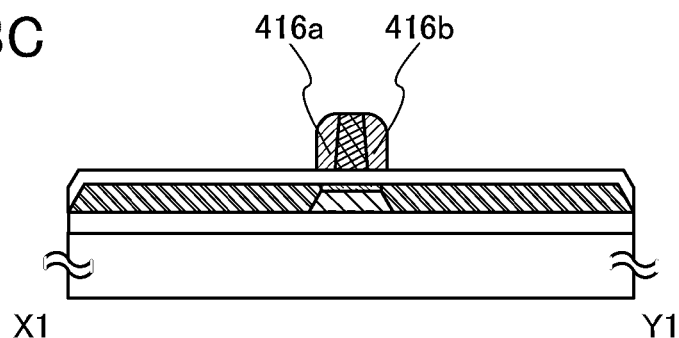

Next, a conductive film is formed over the gate electrode layer 414 and the gate insulating layer 412, and the conductive film is etched to form the sidewall layer 416a and the sidewall layer 416b (see FIG. 3C).

For example, the sidewall layer 416a and the sidewall layer 416b can be formed in a self-aligned manner without using a mask by performing anisotropic etching on the conductive film over the gate electrode layer 414 and the gate insulating layer 412. The anisotropic etching treatment is preferably performed under the conditions that the etching selectivity of the conductive film with respect to the gate electrode layer 414 and the gate insulating layer 412 is high. The sidewall layer 416a and the sidewall layer 416b are formed in a self-aligned manner by anisotropic etching treatment in this manner, variations in the widthes of Lov regions (the Lov lengths) can be suppressed between the source electrode layer 410a side and the drain electrode layer 410b side.

The sidewall layer 416a and the sidewall layer 416b can be formed, for example, by processing a metal film of tungsten, titanium, or the like or a silicon film or the like containing an impurity element such as phosphorus or boron as long as the sidewall layer 416a and the sidewall layer 416b have conductivity. Alternatively, the sidewall layer 416a and the sidewall layer 416b having conductivity may be formed in the following manner: a polycrystalline silicon film is formed over the gate electrode layer 414 and the gate insulating layer 412; a sidewall layer is formed in contact with the gate electrode layer 414 by etching; an impurity element such as phosphorus or boron is added to the sidewall layer by doping; and heat treatment is performed. Note that in this embodiment, the sidewall layer 416a and the sidewall layer 416b have a layered structure of a tungsten film and a silicon oxynitride film. Like this, the sidewall layer 416a and the sidewall layer 416b may have a layered structure of a conductive film and an insulating film.

Next, the insulating layer 418 and the insulating layer 420 are formed over the gate insulating layer 412, the gate electrode layer 414, the sidewall layer 416a, and the sidewall layer 416b. Note that in this embodiment, a layered structure of the insulating layer 418 and the insulating layer 420 is formed over the gate insulating layer 412, the gate electrode layer 414, the sidewall layer 416a, and the sidewall layer 416b; however, one embodiment of the present invention is not limited thereto and an insulating layer with a single-layer structure may be employed. Alternatively, a layered structure of three or more insulating layers may be employed.

The insulating layer 418 or the insulating layer 420 can be formed by a plasma CVD method, a sputtering method, an evaporation method, or the like. In particular, a sputtering method is preferable because an impurity such as water or hydrogen can be prevented from entering the insulating layer 418 or the insulating layer 420. As the insulating layer 418 or the insulating layer 420, an inorganic insulating film such as a silicon oxide film, a silicon oxynitride film, an aluminum oxynitride film, or a gallium oxide film, or the like can be typically used.

Alternatively, as the insulating layer 418 or the insulating layer 420, an aluminum oxide film, a hafnium oxide film, a magnesium oxide film, a zirconium oxide film, a lanthanum oxide film, a barium oxide film, or a metal nitride film (e.g., an aluminum nitride film) can be used.

Note that an aluminum oxide film is preferably provided as the insulating layer 418 or the insulating layer 420. This is because the aluminum oxide film has a high shielding effect (blocking effect) which is impermeable to either oxygen or impurities such as hydrogen and moisture; therefore, in and after the manufacturing process, the aluminum oxide film functions as a protection film that prevents an impurity such as hydrogen or moisture, which causes a change in characteristics, from entering the oxide semiconductor layer 406 and prevents oxygen, which is a main constituent material of the oxide semiconductor, from being released from the oxide semiconductor layer 406.

In order to remove residual moisture from the deposition chamber of the insulating layer 418 or the insulating layer 420 in a manner similar to that of the deposition of the oxide semiconductor layer 406, an entrapment vacuum pump (such as a cryopump) is preferably used. When the insulating layer 418 or the insulating layer 420 is deposited in the deposition chamber evacuated using a cryopump, the impurity concentration of the insulating layer 418 or the insulating layer 420 can be reduced. As an evacuation unit for removing residual moisture from the deposition chamber of the insulating layer 418 or the insulating layer 420, a turbo molecular pump provided with a cold trap may be used.

In this embodiment, an aluminum oxide film is formed as the insulating layer 418, and a silicon oxide film is formed as the insulating layer 420. Note that the aluminum oxide film has a high density (film density higher than or equal to 3.2 g/cm$^3$, preferably higher than or equal to 3.6 g/cm$^3$), whereby the transistor 430 can have stable electrical characteristics. The film density can be measured by Rutherford backscattering spectrometry (RBS) or X-ray reflection (XRR).

Note that in the case where an aluminum oxide film is formed as the insulating layer 418, heat treatment is preferably performed after the formation of the aluminum oxide film. The aluminum oxide film has the function of preventing water (including hydrogen) from entering the oxide semiconductor layer and the function of preventing oxygen from releasing from the oxide semiconductor layer. Therefore, in the case where the oxide semiconductor layer 406 and/or an insulating layer in contact therewith have/has a region in which oxygen exceeds the stoichiometric composition of the film (also referred to as an oxygen-excess region), by performing heat treatment in a state where the aluminum oxide film is provided, at least one oxygen-excess region can be provided in a film of (a bulk of) the oxide semiconductor layer or at an interface between the insulating layer and the oxide semiconductor layer.

Figure 3D:
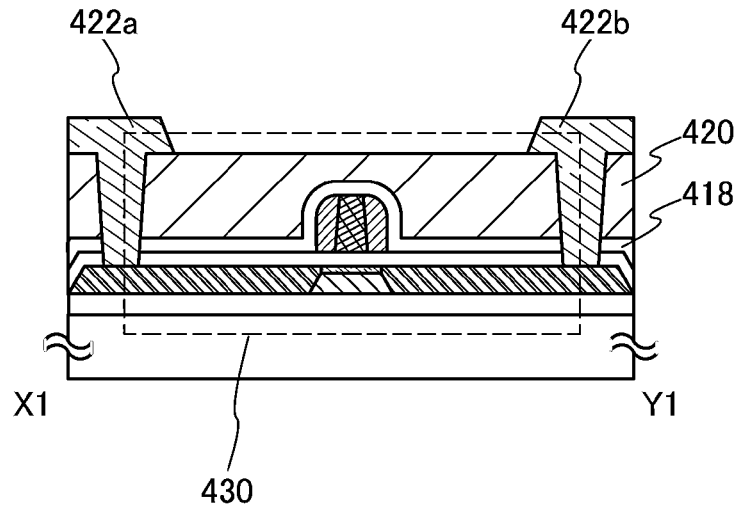

Next, openings which reach the source electrode layer 410a and the drain electrode layer 410b are formed in the insulating layer 420, the insulating layer 418, and the gate insulating layer 412, and the wiring layer 422a and the wiring layer 422b are formed in the openings (see FIG. 3D).

With the use of the wiring layer 422a and the wiring layer 422b, connection to another transistor or another element is formed, which can lead to formation of a variety of circuits. The wiring layers 422a and 422b can be formed using a material and a method which are similar to those for the gate electrode layer 414, the source electrode layer 410a, or the drain electrode layer 410b. For example, a metal film containing an element selected from Al, Cr, Cu, Ta, Ti, Mo, and W, or a metal nitride film containing any of the above elements as its component (e.g., a titanium nitride film, a molybdenum nitride film, or a tungsten nitride film) can be used. Alternatively, a film of a high-melting-point metal such as Ti, Mo, or W or a metal nitride film of any of these elements (e.g., a titanium nitride film, a molybdenum nitride film, or a tungsten nitride film) may be formed over or/and below the metal film such as an Al film or a Cu film. As the conductive film used as the wiring layers 422a and 422b, a conductive metal oxide may be used. Indium oxide ($In_2O_3$), tin oxide ($SnO_2$), zinc oxide (ZnO), indium oxide-tin oxide (ITO), indium oxide-zinc oxide ($In_2O_3$—ZnO), or any of these metal oxide materials containing silicon oxide can be used as the conductive metal oxide.

For example, as the wiring layer 422a and the wiring layer 422b, a single layer of molybdenum, a stack of a tantalum nitride film and a copper film, or a stack of a tantalum nitride film and a tungsten film can be used.

Through the above process, the transistor 430 of this embodiment is formed.

The transistor of this embodiment includes the channel protection layer over the oxide semiconductor layer. In the manufacturing process, the channel protection layer has the function of protecting the oxide semiconductor layer. In addition, the channel protection layer has the function as part of the gate insulating layer of the transistor. With such a structure, damage to the oxide semiconductor layer or a reduction in film thickness can be suppressed, thereby providing a transistor with a high yield.

As described above, according to one embodiment of the disclosed invention, a problem due to miniaturization can be solved. As a result, the size of the transistor can be sufficiently reduced. When the size of the transistor is sufficiently reduced, the area occupied by a semiconductor device is also reduced; thus, the number of semiconductor devices manufactured from one substrate is increased. Accordingly, the manufacturing cost per semiconductor device can be reduced. Since the semiconductor device is downsized, a semiconductor device with a size similar to that of the conventional semiconductor device can have improved functions. Thus, miniaturization of a transistor including an oxide semiconductor can be achieved according to one embodiment of the disclosed invention, and various effects accompanied with the miniaturization can be obtained.

The structures and methods described in this embodiment can be combined as appropriate with any of the structures and methods described in the other embodiments.

(Embodiment 2)

In this embodiment, modification examples of the semiconductor device and the method for manufacturing the semiconductor device described in Embodiment 1, which are illustrated in FIGS. 1A and 1B, FIGS. 2A to 2D, and FIGS. 3A to 3D, will be described with reference to FIGS. 4A and 4B, FIGS. 5A to 5D, and FIGS. 6A to 6D. Note that portions similar to those in FIGS. 1A and 1B, FIGS. 2A to 2D, and FIGS. 3A to 3D are denoted by the same reference numerals, and description thereof is repeated.

<Structure Example of Semiconductor Device (Modification Example 1)>

Figure 4A:
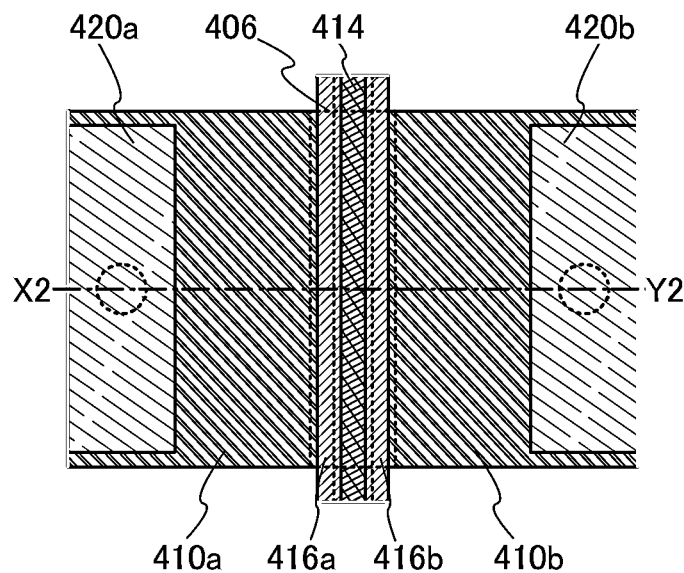
FIGS. 4A and 4B are a plan view and a cross-sectional view of one embodiment of a semiconductor device.
Figure 4B:
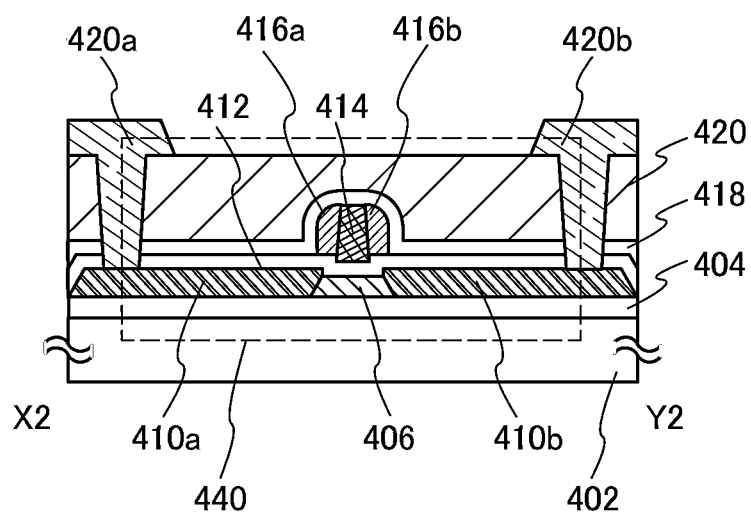

FIGS. 4A and 4B are a plan view and a cross-sectional view illustrating the transistor 440 as an example of a semiconductor device. FIG. 4A is a plan view of the transistor 440, and FIG. 4B is a cross-sectional view taken along the line X2-Y2 in FIG. 4A. Note that in FIG. 4A, some components of the transistor 440 (e.g., the insulating layer 420) are not illustrated for simplicity.

The transistor 440 illustrated in FIGS. 4A and 4B includes, over the substrate 402, the base insulating layer 404; the source electrode layer 410a; the drain electrode layer 410b; the oxide semiconductor layer 406 of which one side surface is in contact with the source electrode layer 410a and the other side surface is in contact with the drain electrode layer 410b in the cross section in the channel length direction; the gate insulating layer 412 being in contact with the top surface of the oxide semiconductor layer 406 and covering the source electrode layer 410a and the drain electrode layer 410b; the gate electrode layer 414 provided in a region overlapping with the oxide semiconductor layer 406 with the gate insulating layer 412 provided therebetween; and the first sidewall layer 416a in contact with one side surface of the gate electrode layer 414 and the second sidewall layer 416b in contact with the other side surface of the gate electrode layer 414 in the cross section in the channel length direction.

As illustrated in FIG. 4B, the oxide semiconductor layer 406 has a smaller thickness than the source electrode layer 410a and the drain electrode layer 410b.

Note that the difference between the transistor 440 in FIGS. 4A and 4B and the transistor 430 of Embodiment 1 in FIGS. 1A and 1B is the presence of a channel protection layer. The transistor 430 includes a channel protection layer and the transistor 440 does not include a channel protection layer.

However, in the process for manufacturing the transistor 440, a channel protection layer having the function of protecting the oxide semiconductor layer 406 is formed. Therefore, damage to the oxide semiconductor layer 406 or a reduction in film thickness can be suppressed in the manufacturing process, thereby providing the transistor 440 with a high yield.

In the transistor 440, at least part of the sidewall layer 416a is over the source electrode layer 410a with the gate insulating layer 412 provided therebetween. At least part of the sidewall layer 416b is over the drain electrode layer 410b with the gate insulating layer 412 provided therebetween. The sidewall layer 416a and the sidewall layer 416b are formed with a semiconductor material or a conductive material and have conductivity. Therefore, the sidewall layer 416a and the sidewall layer 416b can serve as part of the gate electrode layer 414, and thus a region in which the sidewall layer overlaps with the source electrode layer 410a or the drain electrode layer 410b with the gate insulating layer 412 provided therebetween can be substantially an Lov region.

In the case where the width of an Lov region is large, there is a possibility that the parasitic capacitance caused in the region may become large. In this embodiment, however, since the sidewall layers 416a and 416b having conductivity are formed in a self-aligned manner to be in contact with the gate electrode layer 414, a minute Lov region can be formed accurately.

The transistor 440 illustrated in FIGS. 4A and 4B may further include the insulating layer 418 and the insulating layer 420 which are provided over the sidewall layer 416a, the sidewall layer 416b, and the gate electrode layer 414, and the wiring layer 422a and the wiring layer 422b which are provided over the insulating layer 420. Through openings formed in the insulating layer 418, the insulating layer 420, and the gate insulating layer 412, the wiring layer 422a is electrically connected to the source electrode layer 410a, and the wiring layer 422b is electrically connected to the drain electrode layer 410b. Note that the two-layer structure of the insulating layer 418 and the insulating layer 420 is employed in this embodiment, but the present invention is not limited thereto. Alternatively, a layered structure of three or more layers may be employed.

The side surfaces of the oxide semiconductor layer 406, which are in contact with the source electrode layer 410a and the drain electrode layer 410b, are preferably tapered as illustrated in FIG. 4B. The taper angle can be, for example, greater than or equal to 20° and less than or equal to 50°. Note that here, the taper angle refers to an inclined angle formed by the side surface and the bottom surface of the oxide semiconductor layer 406 when the oxide semiconductor layer 406 is seen from the direction vertical to the cross section.

Since the side surface of the oxide semiconductor layer 406 is tapered, a conductive film to be the source electrode layer 410a and the drain electrode layer 410b can be formed with good coverage. In addition, the tapered shape of the side surface of the oxide semiconductor layer 406 can suppress oxygen vacancy caused by oxygen released from the side surface of the oxide semiconductor layer 406, thereby reducing leakage current of the transistor 440.

Furthermore, with the tapered side surface of the oxide semiconductor layer 406, a contact area between the oxide semiconductor layer 406 and the source electrode layer 410a or the drain electrode layer 410b can be increased, thereby reducing contact resistance. When the side surfaces of the oxide semiconductor layer 406 are tapered, a side surface of the source electrode layer 410a and a side surface of the drain electrode layer 410b are inversely tapered. With the oxide semiconductor layer 406, the source electrode layer 410a, and the drain electrode layer 410b which have the above-mentioned shapes, when an electric field is applied between a source and a drain, concentration of the electric field on the oxide semiconductor layer 406 can be relieved.

In the case where the transistor 440 is not provided with a sidewall layer having conductivity, formation of the Lov region needs precise alignment of an oxide semiconductor layer and a gate electrode layer each of which has a small line width. In the transistor 440 of this embodiment, however, since the sidewall layers 416a and 416b having conductivity are provided on the side surfaces of the gate electrode layer 414 in the cross section in the channel length direction, a region in which the sidewall layer 416a overlaps with the source electrode layer 410a and a region in which the sidewall layer 416b overlaps with the drain electrode layer 410b can be substantially Lov regions. Therefore, the degree of freedom in alignment for forming an Lov region can be improved, whereby the transistor 440 in which a decrease in on-state current is suppressed can be provided with a high yield.

In addition, in the case where the length of the island-shaped oxide semiconductor layer 406 in the channel length direction is larger than that of the gate electrode layer 414 in the channel length direction, the degree of freedom in alignment for forming the gate electrode layer 401 can be further improved.

The oxide semiconductor layer 406 is preferably a CAAC-OS (c-axis aligned crystalline oxide semiconductor) film. For the details of the CAAC-OS film, the description in Embodiment 1 can be referred to.

Note that for the details of the other components of the transistor, refer to the following description of a method for manufacturing the transistor 440 using FIGS. 5A to 5D and FIGS. 6A to 6D.

<Example of Process for Manufacturing Transistor 440>

An example of a process for manufacturing the transistor 440 described in this embodiment will be described below with reference to FIGS. 5A to 5D and FIGS. 6A to 6D.

First, the base insulating layer 404 is formed over the substrate 402. The substrate 402 and the base insulating layer 404 can have the structures similar to the structures described in Embodiment 1.

Figure 5A:
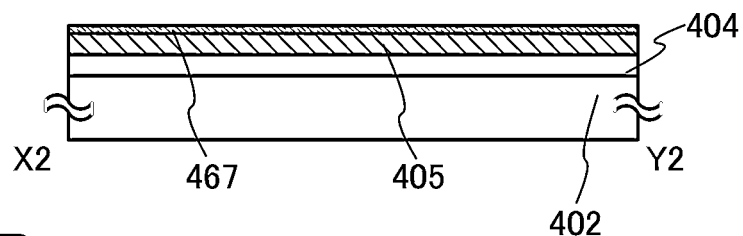
FIGS. 5A to 5D illustrate an example of a method for manufacturing a semiconductor device.
Figure 5B:
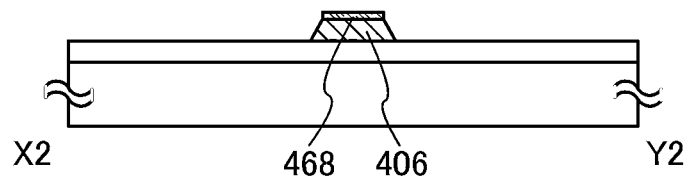

Next, the oxide semiconductor layer 405 and a protection layer 467 are formed over the base insulating layer 404 (see FIG. 5A). The oxide semiconductor layer 405 and the protection layer 467 are preferably formed successively in a vacuum. The successive formation of the oxide semiconductor layer 405 and the protection layer 467 in a vacuum is preferable because it can reduce impurities at an interface between the oxide semiconductor layer 405 and the protection layer 467.

The oxide semiconductor layer 405 has a thickness of, for example, 3 nm to 30 nm, preferably 5 nm to 20 nm. The protection layer 467 has a thickness of, for example, 3 nm to 40 nm, preferably 5 nm to 20 nm.

There is no particular limitation on a material that can be used for the protection layer 467. For example, an insulating material such as silicon oxide, gallium oxide, aluminum oxide, silicon nitride, silicon oxynitride, aluminum oxynitride, or silicon nitride oxide can be used. Furthermore, the protection layer 467 can be formed with a conductive material. For example, a metal film containing an element selected from molybdenum, titanium, tantalum, tungsten, aluminum, copper, chromium, neodymium, and scandium or a metal nitride film containing any of the above elements as its component (e.g., a titanium nitride film, a molybdenum nitride film, or a tungsten nitride film) can be used. As the material that can be used for the protection layer 467, a material which is not eliminated by the CMP treatment for forming the source electrode layer and the drain electrode layer can be selected by a practitioner as appropriate.

Next, the oxide semiconductor layer 405 and the protection layer 467 are processed into the island-shaped oxide semiconductor layer 406 and the island-shaped channel protection layer 468 by a photolithography process and an etching step. Here, as a mask used for processing into the island-shaped oxide semiconductor layer 406 and the island-shaped channel protection layer 468, it is preferable to use a mask having a finer pattern obtained by performing a slimming process on a mask formed by a photolithography method or the like. As the slimming process, an ashing process in which oxygen in a radical state (an oxygen radical) or the like is used can be employed, for example. The oxide semiconductor layer 405 is etched while the ashing process is performed on the mask, so that the oxide semiconductor layer 406 whose side surface is tapered can be formed. However, the slimming process is not limited to the ashing process as long as the mask formed by a photolithography method or the like can be processed into a finer pattern. Note that the channel length (L) of a transistor is determined by the mask formed by the slimming process.

Therefore, a process with high controllability can be employed as the slimming process.

As a result of the slimming process, the line width of the mask formed by a photolithography method or the like can be reduced to a length shorter than or equal to the resolution limit of a light exposure apparatus, preferably less than or equal to half of the resolution limit of the light exposure apparatus, more preferably less than or equal to one third of the resolution limit of the light exposure apparatus. For example, the line width can be greater than or equal to 30 nm and less than or equal to 2000 nm, preferably greater than or equal to 50 nm and less than or equal to 350 nm. This enables further miniaturization of the transistor.

Although there is no particular limitation on a method for forming the island-shaped oxide semiconductor layer 406 and the island-shaped channel protection layer 468, it is preferable to etch the oxide semiconductor layer 406 and the channel protection layer 468 collectively by a dry etching method because it can shorten the manufacturing process.

In this embodiment, the channel protection layer 468 serves as a protection film when CMP treatment is performed later, and is removed after the CMP treatment. For this reason, there are many options for materials that can be used for the channel protection layer 468, and for example, a conductive film, an insulating film, or the like formed by a sputtering method or a CVD method can be used.

The oxide semiconductor layer 406 can have the structure similar to the structure described in Embodiment 1.

Figure 5C:
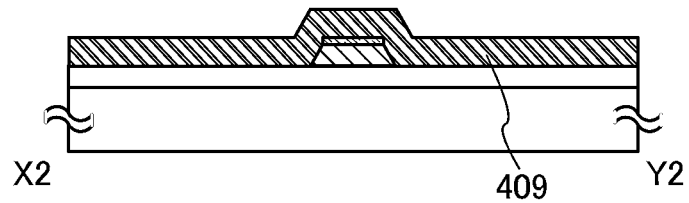
Figure 5D:
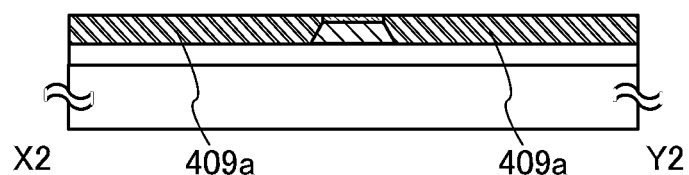

Next, the conductive film 409 to be a source electrode layer and a drain electrode layer (including a wiring formed of the layer the same as the source electrode layer and the drain electrode layer) is formed over the island-shaped oxide semiconductor layer 406 and the island-shaped channel protection layer 468 (see FIG. 5C).

The conductive film 409 can have the structure similar to the structure described in Embodiment 1.

Next, polishing (cutting, grinding) treatment is performed on the conductive film 409 to remove part of the conductive film 409 so that the channel protection layer 468 is exposed. By this polishing treatment, a region of the conductive film 409 which overlaps with the oxide semiconductor layer 406 and the channel protection layer 468 is removed, so that the conductive film 409a having an opening in the region is formed (see FIG. 5D).

As the polishing (cutting, grinding) method, chemical mechanical polishing (CMP) treatment can be used favorably. In this embodiment, the region of the conductive film 409 which overlaps with the oxide semiconductor layer 406 and the channel protection layer 468 is removed by CMP treatment.

Note that the CMP treatment may be performed only once or plural times. When the CMP treatment is performed plural times, first polishing is preferably performed with a high polishing rate followed by final polishing with a low polishing rate. By performing polishing steps with different polishing rates in combination, the planarity of the polished surface can be further improved.

Note that in this embodiment, the CMP treatment is used for removing the region of the conductive film 409 which overlaps with the oxide semiconductor layer 406 and the channel protection layer 468; however, another polishing (grinding or cutting) treatment may be used. Alternatively, the polishing treatment such as CMP treatment may be combined with etching (dry etching or wet etching) treatment, plasma treatment, or the like. For example, after the CMP treatment, dry etching treatment or plasma treatment (e.g., reverse sputtering) may be performed to improve the planarity of the surface to be processed. In the case where the polishing treatment is combined with etching treatment, plasma treatment, or the like, the order of the steps is not particularly limited, and may be set as appropriate depending on the material, thickness, and roughness of the surface of the conductive film 409.

In this embodiment, a top edge of the conductive film 409a and a top edge of the channel protection layer 468 are substantially aligned. Note that the shape of the conductive film 409a (or the shape of the source electrode layer 410a and the drain electrode layer 410b which are obtained by processing the conductive film 409a) differs depending on conditions of the polishing treatment for removing the conductive film 409. For example, the conductive film 409a may be reduced from the surface of the channel protection layer 468 in the thickness direction.

Figure 6A:
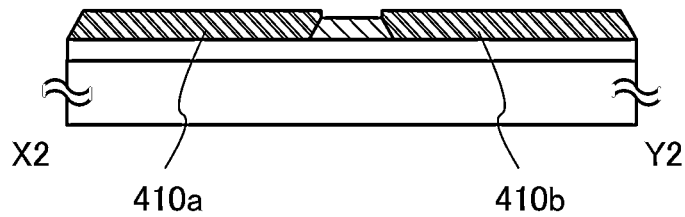
FIGS. 6A to 6D illustrate the example of the method for manufacturing a semiconductor device.

Next, the channel protection layer 468 is removed, and subsequently, the conductive film 409a is processed into the source electrode layer 410a and the drain electrode layer 410b (including a wiring formed of the layer the same as the source electrode layer and the drain electrode layer) by a photolithography process (see FIG. 6A).

There is no particular limitation on a method for removing the channel protection layer 468, and dry etching or wet etching can be used. The conditions that do not damage the oxide semiconductor layer 406 when the channel protection layer 468 is removed are preferable. As illustrated in FIG. 6A, the oxide semiconductor layer 406 is depressed from the top surfaces of the source electrode layer 410a and the drain electrode layer 410b when the channel protection layer 468 is removed. That is, the oxide semiconductor layer 406 has a smaller thickness than the source electrode layer 410a and the drain electrode layer 410b.

Note that the thickness of each of the source electrode layer 410a and the drain electrode layer 410b is 3 nm to 30 nm, preferably 5 nm to 20 nm, for example.

In this embodiment, a method in which the conductive film 409 is formed, the region of the conductive film 409 which overlaps with the oxide semiconductor layer 406 and the channel protection layer 468 is removed by polishing treatment, and selective etching is performed to form the source electrode layer 410a and the drain electrode layer 410b is described; however, embodiments of the present invention are not limited thereto. A method in which the conductive film 410 is selectively etched, and after that the region of the conductive film 409 which overlaps with the oxide semiconductor layer 406 and the channel protection layer 468 is removed by polishing treatment to form the source electrode layer 410a and the drain electrode layer 410b may be employed. Note that in the case where etching treatment is performed before the polishing treatment, the region of the conductive film 409 which overlaps with the oxide semiconductor layer 406 and the channel protection layer 468 is not removed by the etching treatment.

In this embodiment, a method in which after the removal of the channel protection layer 468, the conductive film 409a is processed into the source electrode layer 410a and the drain electrode layer 410b is described; however, an embodiment of the present invention is not limited thereto. For example, the conductive film 409a may be processed into the source electrode layer 410a and the drain electrode layer 410b, and then the channel protection layer 468 may be removed. The removal of the channel protection layer 468 after the formation of the source electrode layer 410a and the drain electrode layer 410b is preferable because the surface of the oxide semiconductor layer 406 is not exposed to an etching gas used for forming the source electrode layer 410a and the drain electrode layer 410b (e.g., chlorine).

In the method for manufacturing a transistor described in this embodiment, when the source electrode layer 410a and the drain electrode layer 410b are formed, etching treatment using a resist mask is not performed at the step of removing the region of the conductive film 409 which overlaps with the oxide semiconductor layer 406 and the channel protection layer 468. For this reason, even when the width of the source electrode layer 410a and the drain electrode layer 410b in the channel length direction is small, precise processing can be performed accurately. Thus, in the process for manufacturing a semiconductor device, the transistors having minute structures and small variations in shapes and characteristics can be manufactured with a high yield.

Next, the gate insulating layer 412 is formed over the oxide semiconductor layer 406, the source electrode layer 410a, and the drain electrode layer 410b. The gate insulating layer 412 can have the structure similar to the structure described in Embodiment 1.

Note that a short-channel effect becomes significant as the gate insulating layer 412 is thicker. For example, in the case of an n-channel transistor, the threshold voltage tends to shift negatively. However, in the method for manufacturing a transistor in this embodiment, the channel protection layer 468 over the oxide semiconductor layer 406 is removed. In addition, the top surfaces of the source electrode layer 410a and the drain electrode layer 410b are planarized by polishing treatment. Therefore, the gate insulating layer 412 can be formed to be thin with good coverage.

Like the base insulating layer 404, the gate insulating layer 412 preferably includes an oxygen-excess region because oxygen vacancy in the oxide semiconductor layer 406 can be filled by excess oxygen contained in the gate insulating layer 412. In the case where the gate insulating layer 412 has a layered structure, the gate insulating layer preferably includes an oxygen-excess region at least in a layer in contact with the oxide semiconductor layer 406. In order to provide the oxygen-excess region in the gate insulating layer 412, for example, the gate insulating layer 412 may be formed in an oxygen atmosphere. Alternatively, the oxygen-excess region may be formed by adding oxygen (including at least one of an oxygen radical, an oxygen atom, and an oxygen ion) to the gate insulating layer 412 after its formation. For example, oxygen can be added by an ion implantation method, an ion doping method, a plasma immersion ion implantation method, or plasma treatment.

Figure 6B:
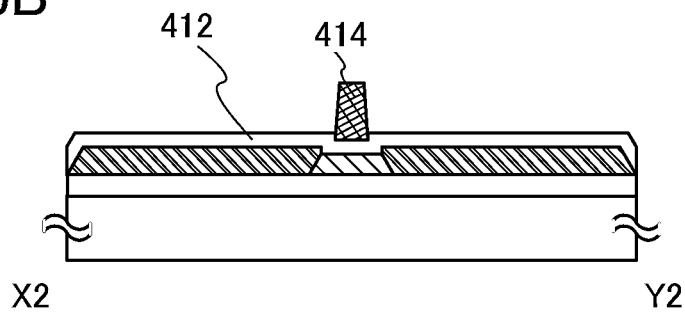

Next, the gate electrode layer 414 is formed in a region overlapping with the island-shaped oxide semiconductor layer 406 with the gate insulating layer 412 provided therebetween (see FIG. 6B). The gate electrode layer 414 can have the structure similar to the structure described in Embodiment 1.

Figure 6C:
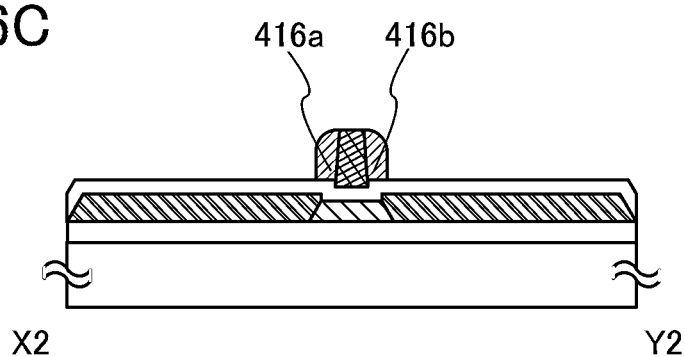

Then, a conductive film is formed over the gate electrode layer 414 and the gate insulating layer 412, and the conductive film is etched to form the sidewall layer 416a and the sidewall layer 416b (see FIG. 6C). The sidewall layer 416a and the sidewall layer 416b can have the structure similar to the structure described in Embodiment 1.

Next, the insulating layer 418 and the insulating layer 420 are formed over the gate insulating layer 412, the gate electrode layer 414, the sidewall layer 416a, and the sidewall layer 416b. The insulating layer 418 and the insulating layer 420 can have the structures similar to the structures described in Embodiment 1.

Figure 6D:
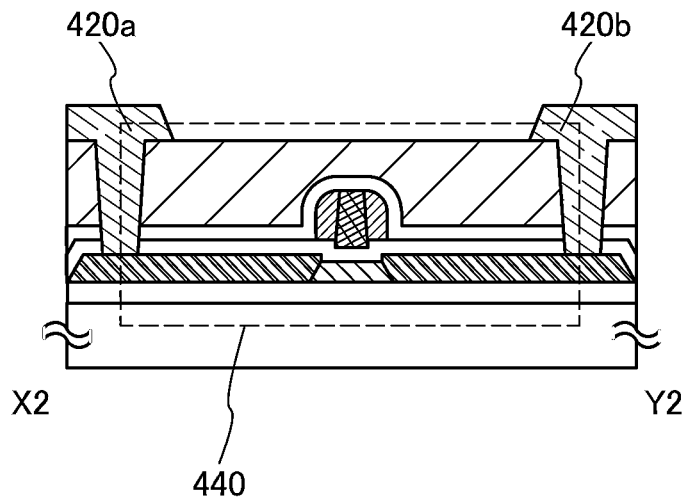

Next, openings which reach the source electrode layer 410a and the drain electrode layer 410b are formed in the insulating layer 420, the insulating layer 418, and the gate insulating layer 412, and the wiring layer 422a and the wiring layer 422b are formed in the openings (see FIG. 6D). The wiring layer 422a and the wiring layer 422b can have the structures similar to the structures described in Embodiment 1.

Through the above process, the transistor 440 of this embodiment is formed.

The transistor of this embodiment includes, in the manufacturing process, the channel protection layer over the oxide semiconductor layer. With such a structure, damage to the oxide semiconductor layer or a reduction in film thickness can be suppressed, thereby providing a transistor with a high yield.

As described above, according to one embodiment of the disclosed invention, a problem due to miniaturization can be solved. As a result, the size of the transistor can be sufficiently reduced. When the size of the transistor is sufficiently reduced, the area occupied by a semiconductor device is also reduced; thus, the number of semiconductor devices manufactured from one substrate is increased. Accordingly, the manufacturing cost per semiconductor device can be reduced. Since the semiconductor device is downsized, a semiconductor device with a size similar to that of the conventional semiconductor device can have improved functions. Thus, miniaturization of a transistor including an oxide semiconductor can be achieved according to one embodiment of the disclosed invention, and various effects accompanied with the miniaturization can be obtained.

The structures and methods described in this embodiment can be combined as appropriate with any of the structures and methods described in the other embodiments.

(Embodiment 3)

In this embodiment, a modification example of the semiconductor device which is described in Embodiment 1 and illustrated in FIGS. 1A and 1B, and a modification example of the semiconductor device which is described in Embodiment 2 and illustrated in FIGS. 4A and 4B will be described with reference to FIGS. 7A and 7B and FIGS. 8A and 8B. Note that portions similar to those in FIGS. 1A and 1B and FIGS. 4A and 4B are denoted by the same reference numerals, and description thereof is not repeated.

<Structure Example of Semiconductor Device (Modification Example 2)>

Figure 7A:
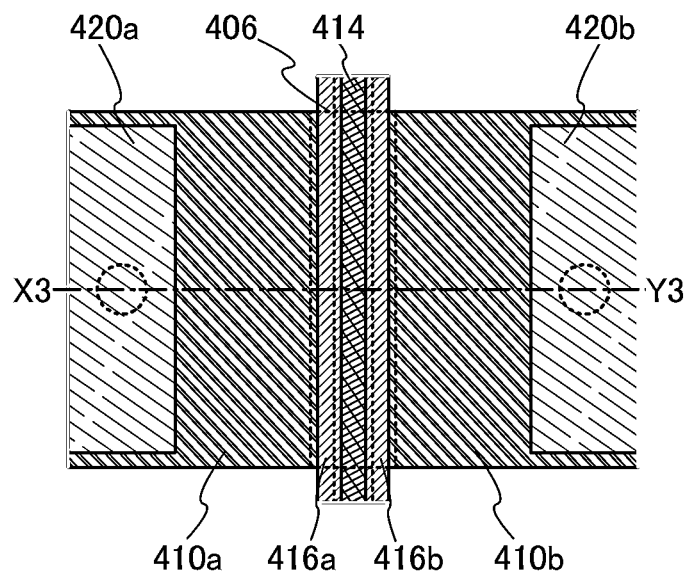
FIGS. 7A and 7B are a plan view and a cross-sectional view of one embodiment of a semiconductor device.
Figure 7B:
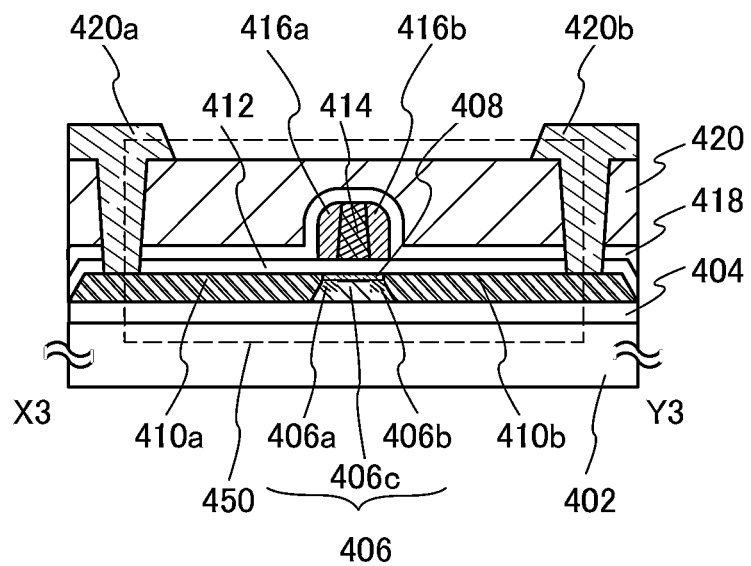

FIGS. 7A and 7B are a plan view and a cross-sectional view illustrating the transistor 450 as an example of a semiconductor device. FIG. 7A is a plan view of the transistor 450, and FIG. 7B is a cross-sectional view taken along the line X3-Y3 in FIG. 7A. Note that in FIG. 7A, some components of the transistor 450 (e.g., the insulating layer 420) are not illustrated for simplicity.

The transistor 450 illustrated in FIGS. 7A and 7B includes, over the substrate 402, the base insulating layer 404; the source electrode layer 410a; the drain electrode layer 410b; the oxide semiconductor layer 406 of which one side surface is in contact with the source electrode layer 410a and the other side surface is in contact with the drain electrode layer 410b in the cross section in the channel length direction; the channel protection layer 408 in contact with a top surface of the oxide semiconductor layer 406; the gate insulating layer 412 in contact with top surfaces of the channel protection layer 408, the source electrode layer 410a, and the drain electrode layer 410b; the gate electrode layer 414 provided in a region overlapping with the oxide semiconductor layer 406 with the channel protection layer 408 and the gate insulating layer 412 provided therebetween; and the first sidewall layer 416a in contact with one side surface of the gate electrode layer 414 and the second sidewall layer 416b in contact with the other side surface of the gate electrode layer 414 in the cross section in the channel length direction.

Note that the difference between the transistor 450 in FIGS. 7A and 7B and the transistor 430 of Embodiment 1 in FIGS. 1A and 1B is the structure of the oxide semiconductor layer 406. In the transistor 450, the oxide semiconductor layer 406 includes a pair of impurity regions (a first impurity region 406a and a second impurity region 406b) and a channel formation region 406c formed between the pair of impurity regions.

<Structure Example of Semiconductor Device (Modification Example 3)>

Figure 8A:
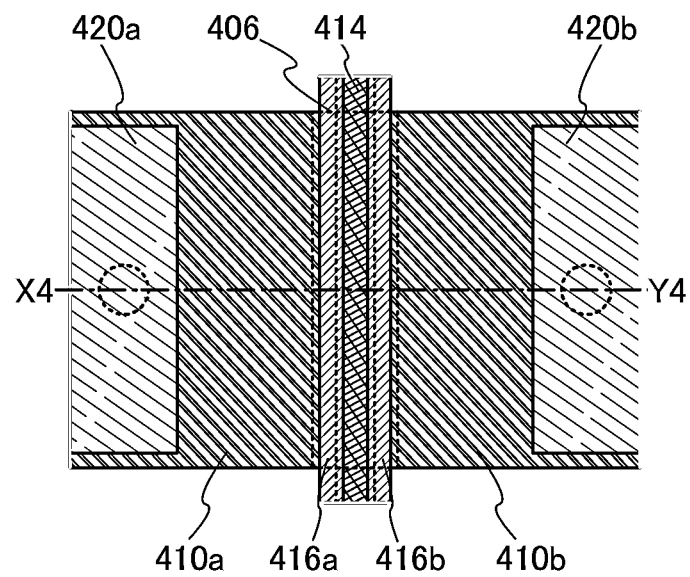
FIGS. 8A and 8B are a plan view and a cross-sectional view of one embodiment of a semiconductor device.
Figure 8B:
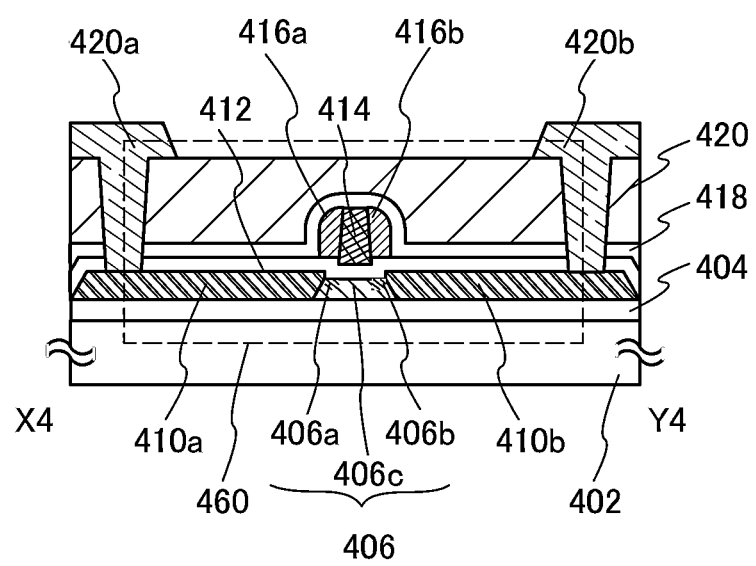

FIGS. 8A and 8B are a plan view and a cross-sectional view illustrating the transistor 460 as an example of a semiconductor device. FIG. 8A is a plan view of the transistor 460, and FIG. 8B is a cross-sectional view taken along the line X4-Y4 in FIG. 8A. Note that in FIG. 8A, some components of the transistor 460 (e.g., the insulating layer 420) are not illustrated for simplicity.

The transistor 460 illustrated in FIGS. 8A and 8B includes, over the substrate 402, the base insulating layer 404; the source electrode layer 410a; the drain electrode layer 410b; the oxide semiconductor layer 406 of which one side surface is in contact with the source electrode layer 410a and the other side surface is in contact with the drain electrode layer 410b in the cross section in the channel length direction; the gate insulating layer 412 being in contact with the top surface of the oxide semiconductor layer 406 and covering the source electrode layer 410a and the drain electrode layer 410b; the gate electrode layer 414 provided in a region overlapping with the oxide semiconductor layer 406 with the gate insulating layer 412 provided therebetween; and the first sidewall layer 416a in contact with one side surface of the gate electrode layer 414 and the second sidewall layer 416b in contact with the other side surface of the gate electrode layer 414 in the cross section in the channel length direction.

Note that the difference between the transistor 460 in FIGS. 8A and 8B and the transistor 440 of Embodiment 2 in FIGS. 4A and 4B is the structure of the oxide semiconductor layer 406. In the transistor 460, the oxide semiconductor layer 406 includes a pair of impurity regions (the first impurity region 406a and the second impurity region 406b) and the channel formation region 406c formed between the pair of impurity regions.

With the structure of the oxide semiconductor layer 406 including a pair of impurity regions (the first impurity region 406a and the second impurity region 406b) as in the transistor 450 and the transistor 460 of this embodiment, the channel length of the transistor can be shortened.

The transistor 450 and the transistor 460 of this embodiment include, in the cross section in the channel length direction, the oxide semiconductor layer 406 including a pair of impurity regions and a channel formation region, and the source electrode layer 410a and the drain electrode layer 410b in contact with the impurity regions in the oxide semiconductor layer 406. Therefore, the contact resistance between the oxide semiconductor layer 406 and the source electrode layer 410a or the drain electrode layer 410b can be reduced, so that the transistors can have excellent on-state characteristics (e.g., on-state current or field effect mobility) and operate and response at higher speed.

For example, the pair of impurity regions (the first impurity region 406a and the second impurity region 406b) can be formed as follows: after the formation of the gate electrode layer 414, a dopant is added to the oxide semiconductor layer 406 using the gate electrode layer 414 as a mask to form the first impurity region 406a and the second impurity region 406b in a self-aligned manner.

Note that the dopant is an impurity which changes the electrical conductivity of the oxide semiconductor layer 406. One or more selected from the following can be used as the dopant: Group 15 elements (typical examples thereof are phosphorus (P), arsenic (As), and antimony (Sb)), boron (B), aluminum (Al), nitrogen (N), argon (Ar), helium (He), neon (Ne), indium (In), fluorine (F), chlorine (Cl), titanium (Ti), and zinc (Zn). As the method for adding the dopant, an ion implantation method, an ion doping method, a plasma immersion ion implantation method, or the like can be used.

As described above, by addition of a dopant using the gate electrode layer 414 as a mask, the channel length of the channel formation region can be shortened in the cross section in the channel length direction. Therefore, the transistor 450 and the transistor 460 can be miniaturized.

Note that in the case where the oxide semiconductor layer 406 does not include an impurity region as in the transistor 430 illustrated in FIGS. 1A and 1B or FIGS. 2A to 2D or the transistor 440, the width of the gate electrode layer 414 in the cross section in the channel length direction can be increased to form an Lov region. However, when the overlap length (the width of the Lov region) between the gate electrode layer 414 and the source electrode layer 410a or the drain electrode layer 410b is large, the parasitic capacitance generated in the region also becomes large. In this embodiment, the gate electrode layer 414 is miniaturized, and the sidewall layers 416a and 416b having conductivity are formed in a self-aligned manner to be in contact with the gate electrode layer 414, so that a minute Lov region can be formed accurately.

The transistor of this embodiment includes, in the manufacturing process, the channel protection layer over the oxide semiconductor layer. With such a structure, damage to the oxide semiconductor layer or a reduction in film thickness can be suppressed, thereby providing a transistor with a high yield.

As described above, according to one embodiment of the disclosed invention, a problem due to miniaturization can be solved. As a result, the size of the transistor can be sufficiently reduced. When the size of the transistor is sufficiently reduced, the area occupied by a semiconductor device is also reduced; thus, the number of semiconductor devices manufactured from one substrate is increased. Accordingly, the manufacturing cost per semiconductor device can be reduced. Since the semiconductor device is downsized, a semiconductor device with a size similar to that of the conventional semiconductor device can have improved functions. Furthermore, effects of high-speed operation, low power consumption, and the like can be obtained in accordance with a reduction in channel length. Thus, miniaturization of a transistor including an oxide semiconductor can be achieved according to one embodiment of the disclosed invention, and various effects accompanied with the miniaturization can be obtained.

The methods, structures, and the like described in this embodiment can be combined as appropriate with any of the methods, structures, and the like described in the other embodiments.

(Embodiment 4)

In this embodiment, an example of a semiconductor device using a transistor described in this specification, being capable of holding stored data even when power is not supplied, and having no limitation on the number of write cycles will be described with reference to drawings.

Figure 9A:
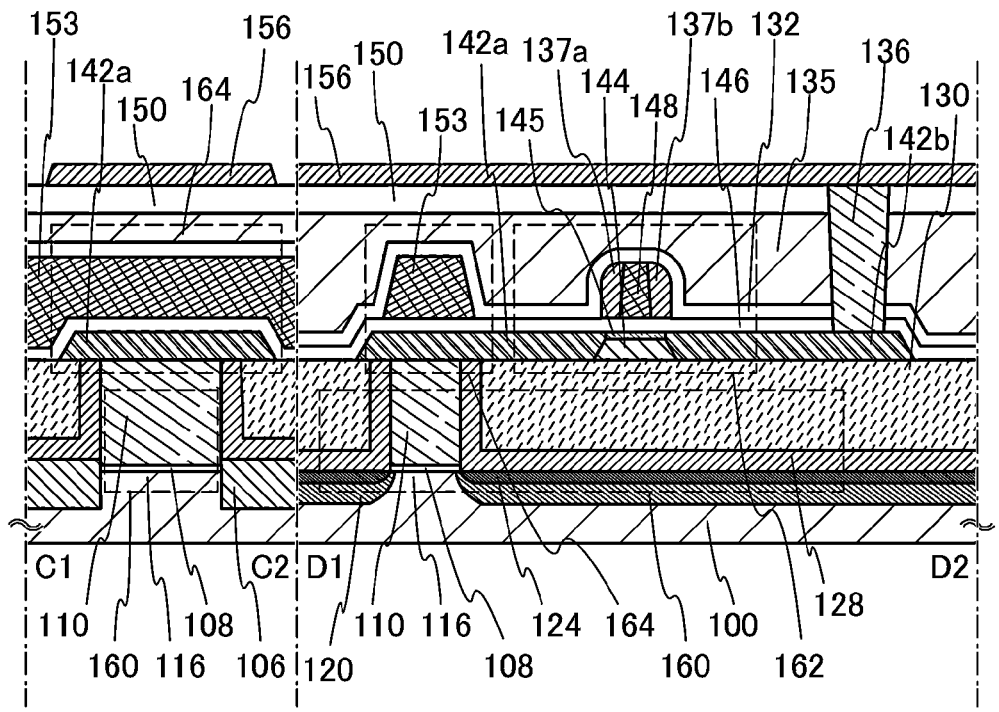
FIGS. 9A to 9C are a cross-sectional view, a plan view, and a circuit diagram of one embodiment of a semiconductor device.
Figure 9B:
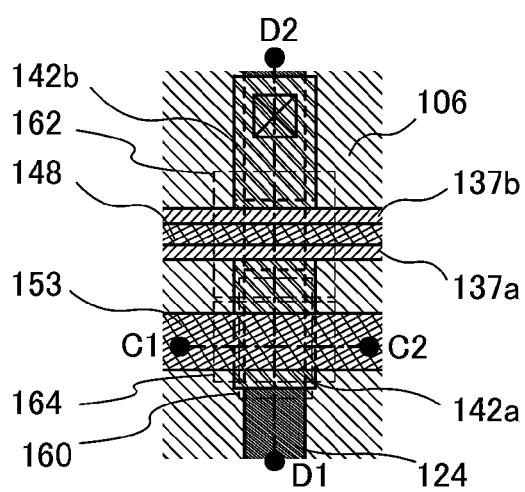
Figure 9C:
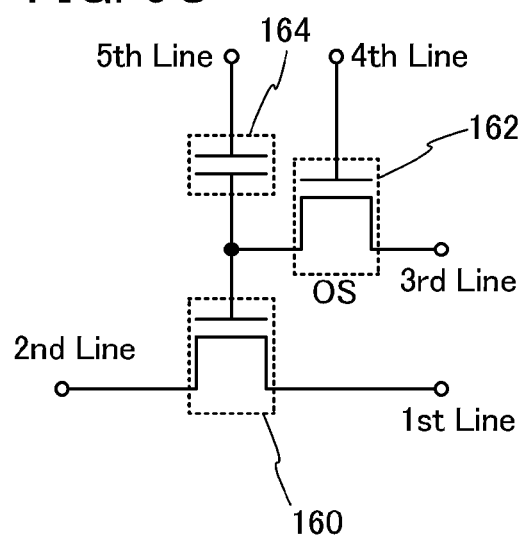

FIGS. 9A to 9C illustrate an example of a structure of a semiconductor device. FIG. 9A illustrates a cross-sectional view of the semiconductor device, FIG. 9B illustrates a plan view of the semiconductor device, and FIG. 9C illustrates a circuit diagram of the semiconductor device. Here, FIG. 9A corresponds to cross sections taken along the line C1-C2 and the line D1-D2 in FIG. 9B.

The semiconductor device illustrated in FIGS. 9A and 9B includes a transistor 160 including a first semiconductor material in a lower portion, and a transistor 162 including a second semiconductor material in an upper portion. The structure of the transistor 430 described in Embodiment 1 is applied to the transistor 162.

Here, the first semiconductor material and the second semiconductor material are preferably materials having different band gaps. For example, the first semiconductor material may be a semiconductor material other than an oxide semiconductor (e.g., silicon) and the second semiconductor material may be an oxide semiconductor. A transistor including a material other than an oxide semiconductor can operate at high speed easily. On the other hand, a transistor including an oxide semiconductor enables charge to be held for a long time owing to its characteristics.

Note that although the transistors 160 and 162 are n-channel transistors here, p-channel transistors can be used. The specific structure of the semiconductor device, such as the material used for the semiconductor device and the structure of the semiconductor device, is not necessarily limited to those described here. For example, the transistor including an oxide semiconductor described in Embodiment 1 may be used as the transistor 162 for holding data.

The transistor 160 in FIG. 9A includes a channel formation region 116 provided in a substrate 100 including a semiconductor material (e.g., silicon), impurity regions 120 provided so that the channel formation region 116 is sandwiched therebetween, intermetallic compound regions 124 in contact with the impurity regions 120, a gate insulating film 108 provided over the channel formation region 116, and the gate electrode layer 110 provided over the gate insulating film 108. Note that a transistor whose source electrode layer and drain electrode layer are not illustrated in a drawing may be referred to as a transistor for the sake of convenience. In such a case, in description of a connection of a transistor, a source region and a source electrode layer may be collectively referred to as a source electrode layer, and a drain region and a drain electrode layer may be collectively referred to as a drain electrode layer. That is, in this specification, the term "source electrode layer" may include a source region.

An element separation insulating layer 106 is provided over the substrate 100 to surround the transistor 160, and an insulating layer 128 and an insulating layer 130 are provided to cover the transistor 160. Note that in the transistor 160, sidewall insulating layers may be formed on side surfaces of the gate electrode layer 110, and the impurity regions 120 may include regions having different impurity concentrations.

The transistor 160 including a single crystal semiconductor substrate can operate at high speed. Thus, when the transistor is used as a reading transistor, data can be read at high speed. In this embodiment, two insulating films are formed to cover the transistor 160. Note that the insulating film may also be formed as a single layer or a stacked layer of three or more layers. As treatment prior to the formation of the transistor 162 and a capacitor 164, CMP treatment is performed on the insulating films formed over the transistor 160, whereby the insulating layer 128 and the insulating layer 130 which are planarized are formed and, at the same time, a top surface of the gate electrode layer 110 is exposed.

As each of the insulating layer 128 and the insulating layer 130, an inorganic insulating film such as a silicon oxide film, a silicon oxynitride film, an aluminum oxide film, an aluminum oxynitride film, a silicon nitride film, an aluminum nitride film, a silicon nitride oxide film, or an aluminum nitride oxide film can be used, for example. The insulating layer 128 and the insulating layer 130 can be formed by a plasma CVD method, a sputtering method, or the like.

Alternatively, an organic material such as polyimide, an acrylic resin, or a benzocyclobutene-based resin can be used. Other than the above-described organic materials, it is also possible to use a low-dielectric constant material (a low-k material) or the like. In the case of using an organic material, the insulating layer 128 and the insulating layer 130 may be formed by a wet method such as a spin coating method or a printing method.

Note that in this embodiment, a silicon nitride film is used as the insulating layer 128, and a silicon oxide film is used as the insulating layer 130.

Planarization treatment is preferably performed on a region, where an oxide semiconductor layer 144 is formed, in a surface of the insulating layer 130. In this embodiment, the oxide semiconductor layer 144 is formed over the insulating layer 130 which is sufficiently planarized by polishing treatment such as CMP treatment (the average surface roughness of the surface of the insulating layer 130 is preferably less than or equal to 0.15 nm).

The transistor 162 illustrated in FIG. 9A includes an oxide semiconductor in a channel formation region. Here, it is preferable that the oxide semiconductor layer 144 included in the transistor 162 be highly purified. With the use of such a highly purified oxide semiconductor, the transistor 162 having extremely favorable off-state characteristics can be obtained.

Since the off-state current of the transistor 162 is small, the transistor 162 enables stored data to be held for a long time. In other words, a semiconductor memory device in which refresh operation is unnecessary or the frequency of refresh operation is extremely low can be provided, resulting in a sufficient reduction in power consumption.

The transistor 162 includes a channel protection layer 145 over the oxide semiconductor layer 144. In the manufacturing process, the channel protection layer 145 has the function of protecting the oxide semiconductor layer 144. In addition, the channel protection layer 145 has the function as part of the gate insulating layer of the transistor 162. With such a structure, damage to the oxide semiconductor layer 144 or a reduction in film thickness can be suppressed. As described above, a problem due to miniaturization can be solved. As a result, the size of the transistor 162 can be sufficiently reduced.

In the cross section of the transistor 162 in the channel length direction, the side surfaces of the gate electrode layer 148 is provided with the sidewall layers 137a and 137b having conductivity. The sidewall layers 137a and 137b having conductivity overlap with an electrode layer 142a and an electrode layer 142b, respectively, with a gate insulating layer 146 provided therebetween; therefore, the transistor 162 can be a transistor which substantially has an Lov region, whereby a decrease in on-state current of the transistor 162 can be suppressed.

An insulating layer 132, an insulating layer 135, and an insulating layer 150 each of which has a single-layer structure or a layered structure are provided over the transistor 162. In this embodiment, an aluminum oxide film is used as the insulating layer 132 and the insulating layer 150. When the aluminum oxide film has high density (the film density is higher than or equal to 3.2 g/cm³, preferably higher than or equal to 3.6 g/cm³), the transistor 162 can have stable electric characteristics.

A conductive film 153 is provided in a region overlapping with the electrode layer 142a of the transistor 162 with the gate insulating layer 146 provided therebetween. The capacitor 164 includes the electrode layer 142a, the gate insulating layer 146, and the conductive film 153. That is, the electrode layer 142a of the transistor 162 functions as one electrode of the capacitor 164, and the conductive film 153 functions as the other electrode of the capacitor 164. Note that in the case where the capacitor 164 is not needed, the capacitor 164 may be omitted. Alternatively, the capacitor 164 may be separately provided above the transistor 162.

In this embodiment, the conductive film 153 and the gate electrode layer 148 of the transistor 162 can be formed at the same manufacturing step. Note that a sidewall layer may be formed on a side surface of the conductive film 153 at the step of forming the sidewall layers 137a and 137b on the side surfaces of the gate electrode layer 148.

A wiring 156 for connecting the transistor 162 to another transistor is provided over the insulating layer 150. The wiring 156 is electrically connected to the electrode layer 142b through an electrode layer 136 formed in an opening formed in the insulating layer 150, the insulating layer 135, the gate insulating layer 132, and the gate insulating layer 146.

In FIGS. 9A and 9B, the transistor 160 is provided so as to overlap with at least part of the transistor 162, and a source region or a drain region of the transistor 160 is preferably provided to overlap with part of the oxide semiconductor layer 144. Furthermore, the transistor 162 and the capacitor 164 are provided so as to overlap with at least part of the transistor 160. For example, the conductive film 153 of the capacitor 164 is provided to overlap with at least part of the gate electrode layer 110 of the transistor 160. With such a planar layout, the area occupied by the semiconductor device can be reduced; thus, the degree of integration can be increased.

The electrical connection between the electrode layer 142b and the wiring 156 may be established by direct contact of the electrode layer 142b and the wiring 156 without providing the electrode layer 136. Alternatively, the electrical connection may be established through a plurality of electrode layers.

Next, an example of a circuit configuration corresponding to FIGS. 9A and 9B is illustrated in FIG. 9C.

In FIG. 9C, a first wiring (1st Line) is electrically connected to one of a source electrode layer and a drain electrode layer of the transistor 160, and a second wiring (2nd Line) is electrically connected to the other of the source electrode layer and the drain electrode layer of the transistor 160. A third wiring (3rd Line) is electrically connected to one of the source electrode layer and the drain electrode layer of the transistor 162, and a fourth wiring ($4\text{th}_{Line}$) is electrically connected to the gate electrode layer of the transistor 162. The gate electrode layer of the transistor 160 and the other of the source electrode layer and the drain electrode layer of the transistor 162 are electrically connected to one of electrodes of the capacitor 164. A fifth wiring (5th Line) is electrically connected to the other of the electrodes of the capacitor 164.

The semiconductor device in FIG. 9C utilizes a characteristic in which the potential of the gate electrode layer of the transistor 160 can be held, and thus enables writing, holding, and reading of data as follows.

Writing and holding of data are described. First, the potential of the fourth wiring is set to a potential at which the transistor 162 is turned on, so that the transistor 162 is turned on. Thus, the potential of the third wiring is applied to the gate electrode layer of the transistor 160 and the capacitor 164. In other words, a predetermined charge is supplied to the gate electrode layer of the transistor 160 (i.e., writing of data). Here, one of two kinds of charges providing different potentials (hereinafter referred to as a Low level charge and a High level charge) is given. Then, the potential of the fourth wiring is set to a potential at which the transistor 162 is turned off, so that the transistor 162 is turned off. Thus, the charge given to the gate electrode layer of the transistor 160 is held (i.e., holding of data).

Since the off-state current of the transistor 162 is extremely small, the charge of the gate electrode layer of the transistor 160 is held for a long time.

Next, reading of data is described. By supplying an appropriate potential (reading potential) to the fifth wiring while supplying a predetermined potential (constant potential) to the first wiring, the potential of the second wiring varies depending on the amount of charge held in the gate electrode layer of the transistor 160. This is because in general, when the transistor 160 is an n-channel transistor, an apparent threshold voltage $V_{th\_H}$ in the case where a High level charge is given to the gate electrode layer of the transistor 160 is lower than an apparent threshold voltage $V_{th\_L}$ in the case where a Low level charge is given to the gate electrode layer of the transistor 160. Here, an apparent threshold voltage refers to the potential of the fifth wiring, which is needed to turn on the transistor 160. Thus, the potential of the fifth wiring is set to a potential $V_0$ which is between $V_{th\_H}$ and $V_{th\_L}$, whereby charge supplied to the gate electrode layer of the transistor 160 can be determined. For example, in the case where the High level charge is supplied in writing, when the potential of the fifth wiring is set to $V_0$ ($>V_{th\_H}$), the transistor 160 is turned on. In the case where the Low level charge is supplied in writing, even when the potential of the fifth wiring is set to $V_0$ ($<V_{th\_L}$), the transistor 160 remains in an off state. Therefore, the stored data can be read by the potential of the second wiring.

Note that in the case where memory cells are arrayed, it is necessary that data of only a desired memory cell can be read. In the case where such reading is not performed, a potential at which the transistor 160 is turned off regardless of the state of the gate electrode layer, that is, a potential smaller than $V_{th\_H}$ may be applied to the fifth wiring. Alternatively, a potential at which the transistor 160 is turned on regardless of the state of the gate electrode layer, that is, a potential larger than $V_{th\_L}$ may be applied to the fifth wiring.

When a transistor having a channel formation region formed using an oxide semiconductor and having extremely small off-state current is applied to the semiconductor device of this embodiment, the semiconductor device can hold data for an extremely long time. In other words, power consumption can be adequately reduced because refresh operation becomes unnecessary or the frequency of refresh operation can be extremely low. Moreover, stored data can be held for a long time even when power is not supplied (note that a potential is preferably fixed).

Furthermore, in the semiconductor device described in this embodiment, high voltage is not needed for writing data and there is no problem of deterioration of elements. For example, unlike a conventional non-volatile memory, it is not necessary to inject and extract electrons into and from a floating gate; thus, the problem of deterioration of a gate insulating layer does not occur. In other words, the semiconductor device according to one embodiment of the present invention does not have a limit on the number of times of writing which is a problem in a conventional nonvolatile memory, and reliability thereof is drastically improved. Moreover, since data is written by turning on or off a transistor, high-speed operation can be easily achieved.

As described above, a miniaturized and highly-integrated semiconductor device having high electric characteristics and a method for manufacturing the semiconductor device can be provided.

The structures and methods described in this embodiment can be combined as appropriate with any of the structures and methods described in the other embodiments.

(Embodiment 5)

In this embodiment, a structure of a semiconductor device using the transistor described in Embodiment 1, being capable of holding stored data even when power is not supplied, and having no limitation on the number of write cycles, which is different from the structure described in Embodiment 4, will be described with reference to FIGS. 10A and 10B and FIGS. 11A and 11B.

Figure 10A:
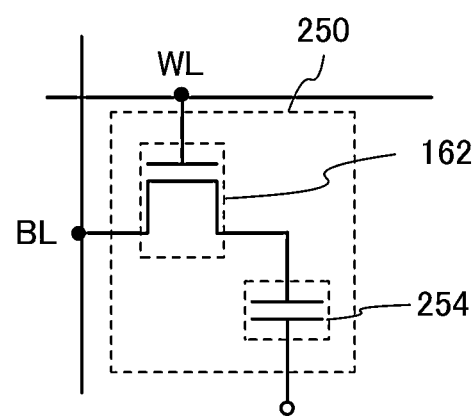
FIGS. 10A and 10B are a circuit diagram and a perspective view of one embodiment of a semiconductor device.
Figure 10B:
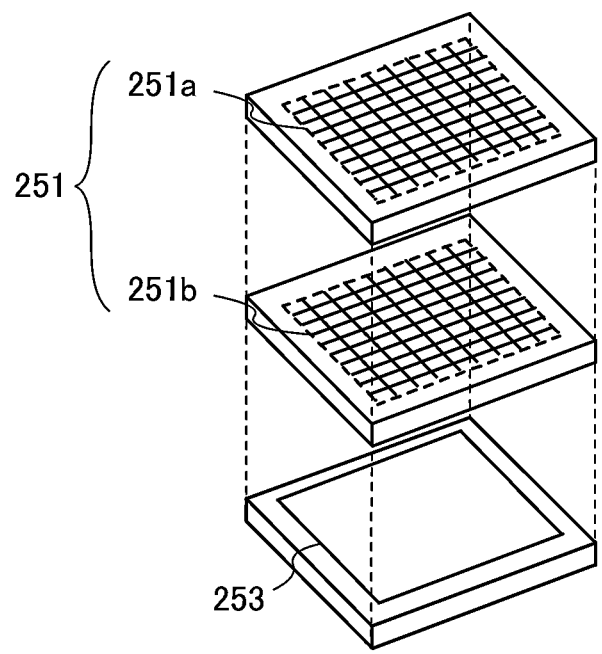

FIG. 10A illustrates an example of a circuit configuration of a semiconductor device, and FIG. 10B is a conceptual diagram illustrating an example of a semiconductor device. First, the semiconductor device illustrated in FIG. 10A is described, and then, the semiconductor device illustrated in FIG. 10B is described.

In the semiconductor device illustrated in FIG. 10A, a bit line BL is electrically connected to one of a source electrode layer and a drain electrode layer of the transistor 162, a word line WL is electrically connected to a gate electrode layer of the transistor 162, and the other of the source electrode layer and the drain electrode layer of the transistor 162 is electrically connected to a first terminal of the capacitor 254.

Next, writing and holding of data in the semiconductor device (a memory cell 250) illustrated in FIG. 10A are described.

First, the potential of the word line WL is set to a potential at which the transistor 162 is turned on, so that the transistor 162 is turned on. Thus, the potential of the bit line BL is applied to the first terminal of the capacitor 254 (i.e., writing of data). Then, the potential of the word line WL is set to a potential at which the transistor 162 is turned off, so that the transistor 162 is turned off. Thus, the potential of the first terminal of the capacitor 254 is held (i.e., holding of data).

The transistor 162 including an oxide semiconductor has extremely small off-state current. For this reason, when the transistor 162 is turned off, the potential of the first terminal of the capacitor 254 (or charge accumulated in the capacitor 254) can be held for an extremely long time.

Next, reading of data is described. When the transistor 162 is turned on, the bit line BL which is in a floating state and the capacitor 254 are electrically connected to each other, and the charge is redistributed between the bit line BL and the capacitor 254. As a result, the potential of the bit line BL is changed. The amount of change in the potential of the bit line BL varies depending on the potential of the first terminal of the capacitor 254 (or charge accumulated in the capacitor 254).

For example, the potential of the bit line BL after charge redistribution is $(C_B \times V_{B0} + C \times V)/(C_B + C)$, where V is the potential of the first terminal of the capacitor 254, C is the capacitance of the capacitor 254, $C_B$ is the capacitance of the bit line BL (hereinafter also referred to as bit line capacitance), and $V_{B0}$ is the potential of the bit line BL before the charge redistribution. Therefore, assuming that the memory cell 250 is in either of two states in which the potentials of the first terminal of the capacitor 254 are $V_1$ and $V_0$ ($V_1 > V_0$), the potential of the bit line BL in the case of holding the potential $V_1 (=(C_B \times V_{B0} + C \times V_1)/(C_B + C))$ is higher than the potential of the bit line BL in the case of holding the potential $V_0 (=(C_B \times V_{B0} + C \times V_0)/(C_B + C))$.

Then, by comparing the potential of the bit line BL with a predetermined potential, data can be read.

As described above, the semiconductor device illustrated in FIG. 10A can hold charge accumulated in the capacitor 254 for a long time because the off-state current of the transistor 162 is extremely small. In other words, power consumption can be adequately reduced because refresh operation becomes unnecessary or the frequency of refresh operation can be extremely low. Even when power is not supplied, stored data can be held for a long time.

Next, the semiconductor device illustrated in FIG. 10B is described.

The semiconductor device illustrated in FIG. 10B includes memory cell arrays 251a and 251b each including the memory cells 250 illustrated in FIG. 10A as a memory circuit in an upper portion. Note that here, a plurality of memory cell arrays (the memory cell arrays 251a and 251b) is referred to as a memory cell array 251.

The semiconductor device illustrated in FIG. 10B includes, in the bottom portion, a peripheral circuit 253 which is needed to operate the memory cell array 251. Note that the peripheral circuit 253 is electrically connected to the memory cell array 251.

With the structure illustrated in FIG. 10B, the peripheral circuit 253 can be provided under the memory cell array 251 (the memory cell arrays 251a and 251b). Thus, the size of the semiconductor device can be decreased.

It is preferable that a semiconductor material for a transistor provided in the peripheral circuit 253 be different from that for the transistor 162. For example, silicon, germanium, silicon germanium, silicon carbide, or gallium arsenide can be used, and a single crystal semiconductor is preferably used. Alternatively, an organic semiconductor material or the like may be used. A transistor including such a semiconductor material can operate at sufficiently high speed. Therefore, with the transistor, achieve a variety of circuits (e.g., a logic circuit or a driver circuit) which needs to operate at high speed can be favorably achieved.

Note that FIG. 10B illustrates the semiconductor device including the memory cell array 251 (a structure in which the memory cell arrays 251a and 251b are stacked) as an example; however, the number of memory cell arrays to be stacked is not limited thereto. Three or more memory cell arrays may be stacked.

Next, a specific structure of the memory cell 250 illustrated in FIG. 10A is described with reference to FIGS. 11A and 11B.

Figure 11A:
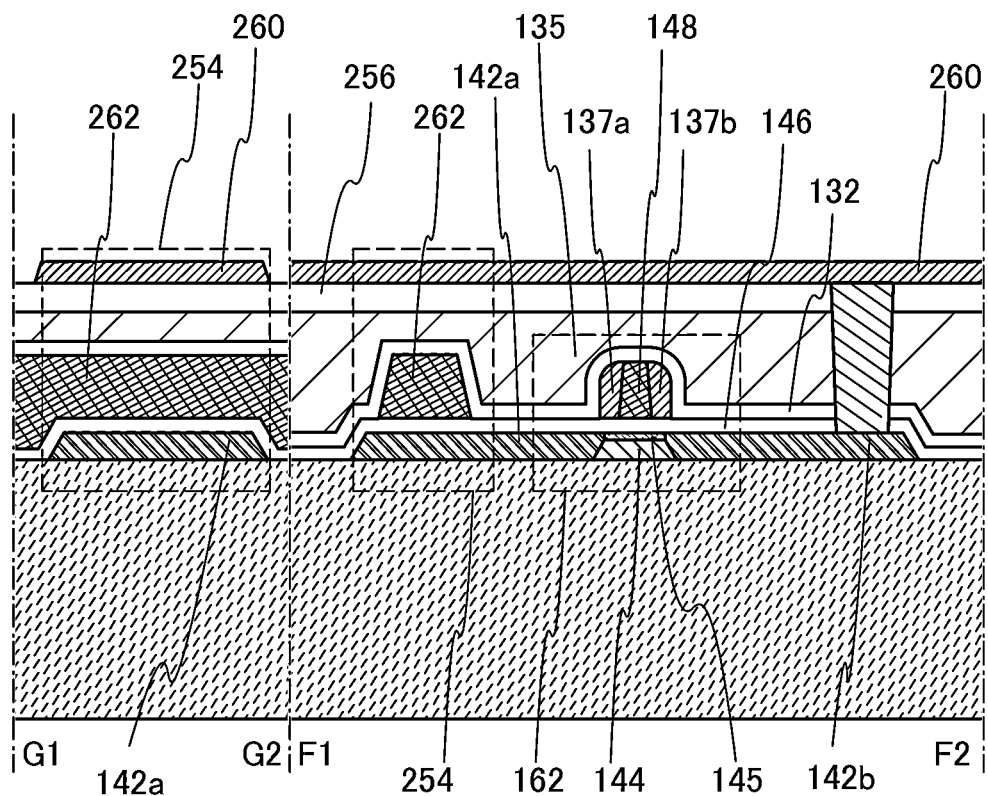
FIGS. 11A and 11B are a cross-sectional view and a plan view of one embodiment of a semiconductor device.
Figure 11B:
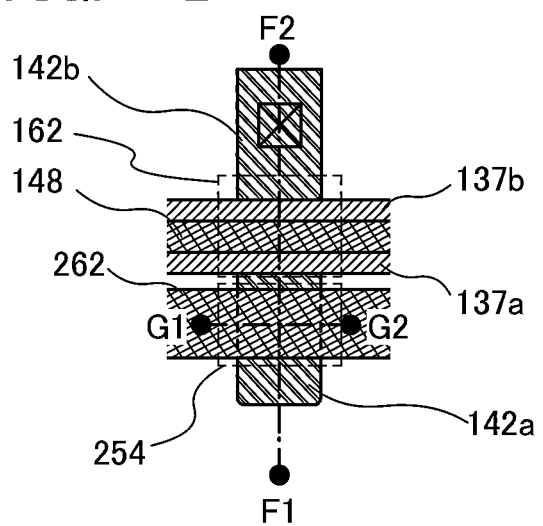

FIGS. 11A and 11B illustrate an example of a structure of the memory cell 250. FIG. 11A illustrates a cross-sectional view of the memory cell 250, and FIG. 11B is a plan view of the memory cell 250. Here, FIG. 11A corresponds to cross sections taken along the line F1-F2 and the line G1-G2 in FIG. 11B.

The transistor 162 illustrated in FIGS. 11A and 11B can have the same structure as that described in Embodiment 1.

In the cross section of the transistor 162 in the channel length direction, the side surfaces of the gate electrode layer 148 is provided with the sidewall layers 137a and 137b having conductivity. The sidewall layers 137a and 137b having conductivity overlap with the electrode layers 142a and 142b, respectively, with the gate insulating layer 146 provided therebetween; therefore, the transistor 162 can be a transistor which substantially has an Lov region, whereby a decrease in on-state current of the transistor 162 can be suppressed.

The transistor 162 includes the channel protection layer 145 over the oxide semiconductor layer 144. In the manufacturing process, the channel protection layer 145 has the function of protecting the oxide semiconductor layer 144. In addition, the channel protection layer 145 has the function as part of the gate insulating layer of the transistor 162. With such a structure, damage to the oxide semiconductor layer 144 or a reduction in film thickness can be suppressed. As described above, a problem due to miniaturization can be solved. As a result, the size of the transistor 162 can be sufficiently reduced.

A conductive film 262 is provided in a region overlapping with the electrode layer 142a of the transistor 162 with the gate insulating layer 146 provided therebetween. The capacitor 254 includes the electrode layer 142a, the gate insulating layer 146, and the conductive film 262. That is, the electrode layer 142a of the transistor 162 functions as one of electrodes of the capacitor 254, and the conductive film 262 functions as the other of the electrodes of the capacitor 254.

The insulating layers 132, 135, and 256 each having a single-layer structure or a layered structure are provided over the transistor 162 and the capacitor 254. Furthermore, a wiring layer 260 for connecting the adjacent memory cells is provided over the insulating layer 256. The wiring layer 260 is electrically connected to the electrode layer 142b of the transistor 162 through an opening formed in the insulating layer 256, the insulating layer 135, the insulating layer 132, and the gate insulating layer 146. Note that the wiring layer 260 may be directly connected to the electrode layer 142b. The wiring layer 260 corresponds to the bit line BL in the circuit diagram in FIG. 10A.

In FIGS. 11A and 11B, the electrode layer 142b of the transistor 162 can also function as a source electrode layer of a transistor included in the adjacent memory cell. With such a planar layout, the area occupied by the semiconductor device can be reduced; thus, the degree of integration can be increased.

As described above, the plurality of memory cells formed in multiple layers includes a transistor including an oxide semiconductor. Since the off-state current of the transistor including an oxide semiconductor is small, the transistor enables stored data to be held for a long time. In other words, the frequency of refresh operation can be extremely lowered, which results in a sufficient reduction in power consumption.

A semiconductor device having a novel feature can be obtained by being provided with both a peripheral circuit including the transistor including a material other than an oxide semiconductor (in other words, a transistor capable of operating at sufficiently high speed) and a memory circuit including the transistor including an oxide semiconductor (in a broader sense, a transistor with sufficiently small off-state current). In addition, with a structure where the peripheral circuit and the memory circuit are stacked, the degree of integration of the semiconductor device can be increased.

As described above, a miniaturized and highly-integrated semiconductor device having high electric characteristics and a method for manufacturing the semiconductor device can be provided.

This embodiment can be implemented in appropriate combination with the structures described in the other embodiments.

(Embodiment 6)

In this embodiment, examples of application of the semiconductor device described in any of the above embodiments to portable devices such as a mobile phone, a smartphone, or an e-book reader are described with reference to FIGS. 12A and 12B, FIG. 13, FIG. 14, and FIG. 15.

In portable devices such as a mobile phone, a smartphone, and an e-book reader, an SRAM or a DRAM is used to store image data temporarily. This is because response speed of a flash memory is low and thus a flash memory is not suitable for image processing. On the other hand, an SRAM or a DRAM has the following characteristics when used for temporary storage of image data.

Figure 12A:
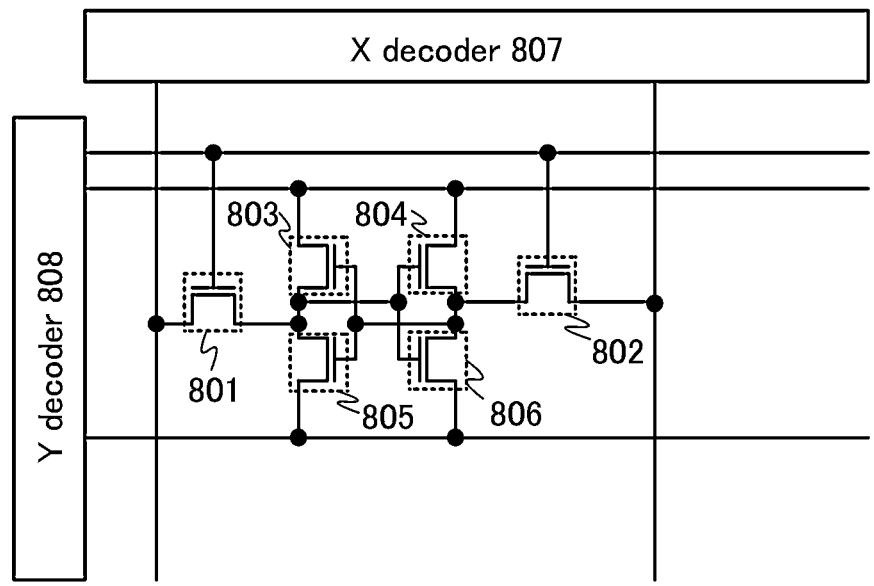
FIGS. 12A and 12B are circuit diagrams of one embodiment of a semiconductor device.

In a normal SRAM, as illustrated in FIG. 12A, one memory cell includes six transistors, which are a transistor 801, a transistor 802, a transistor 803, a transistor 804, a transistor 805, and a transistor 806, and they are driven by an X decoder 807 and a Y decoder 808. The transistors 803 and 805 form an inverter, and the transistors 804 and 806 form an inverter, which enables high-speed driving. However, since one memory cell includes six transistors, an SRAM has a disadvantage in that the area of the memory cell is large. Provided that the minimum feature size of a design rule is F, the area of a memory cell in an SRAM is generally 100 $F^2$ to 150 $F^2$. Therefore, the price per bit of an SRAM is the most expensive among memory devices.

Figure 12B:
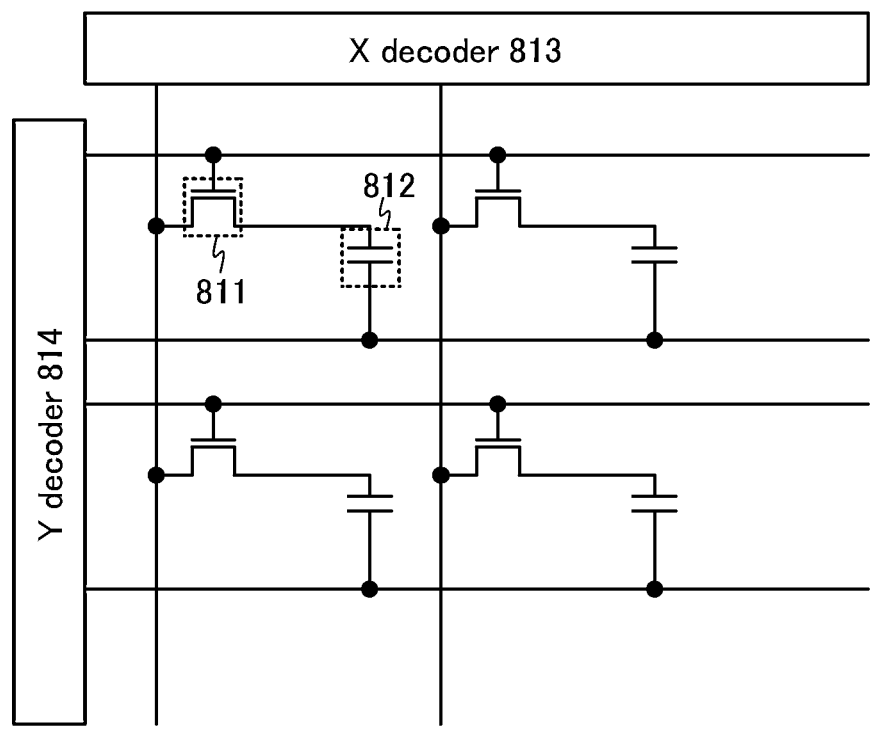

On the other hand, as illustrated in FIG. 12B, a memory cell in a DRAM includes a transistor 811 and a storage capacitor 812, and is driven by an X decoder 813 and a Y decoder 814. One cell includes one transistor and one capacitor and thus the area of the memory cell is small. The area of a memory cell of a DRAM is generally less than or equal to 10 $F^2$. Note that the DRAM needs to be refreshed periodically and consumes electric power even when a rewriting operation is not performed.

However, the area of the memory cell of the semiconductor device described in the above embodiments is about 10 $F^2$ and frequent refreshing is not needed. Therefore, the area of the memory cell is reduced, and the power consumption can be reduced.

Figure 13:
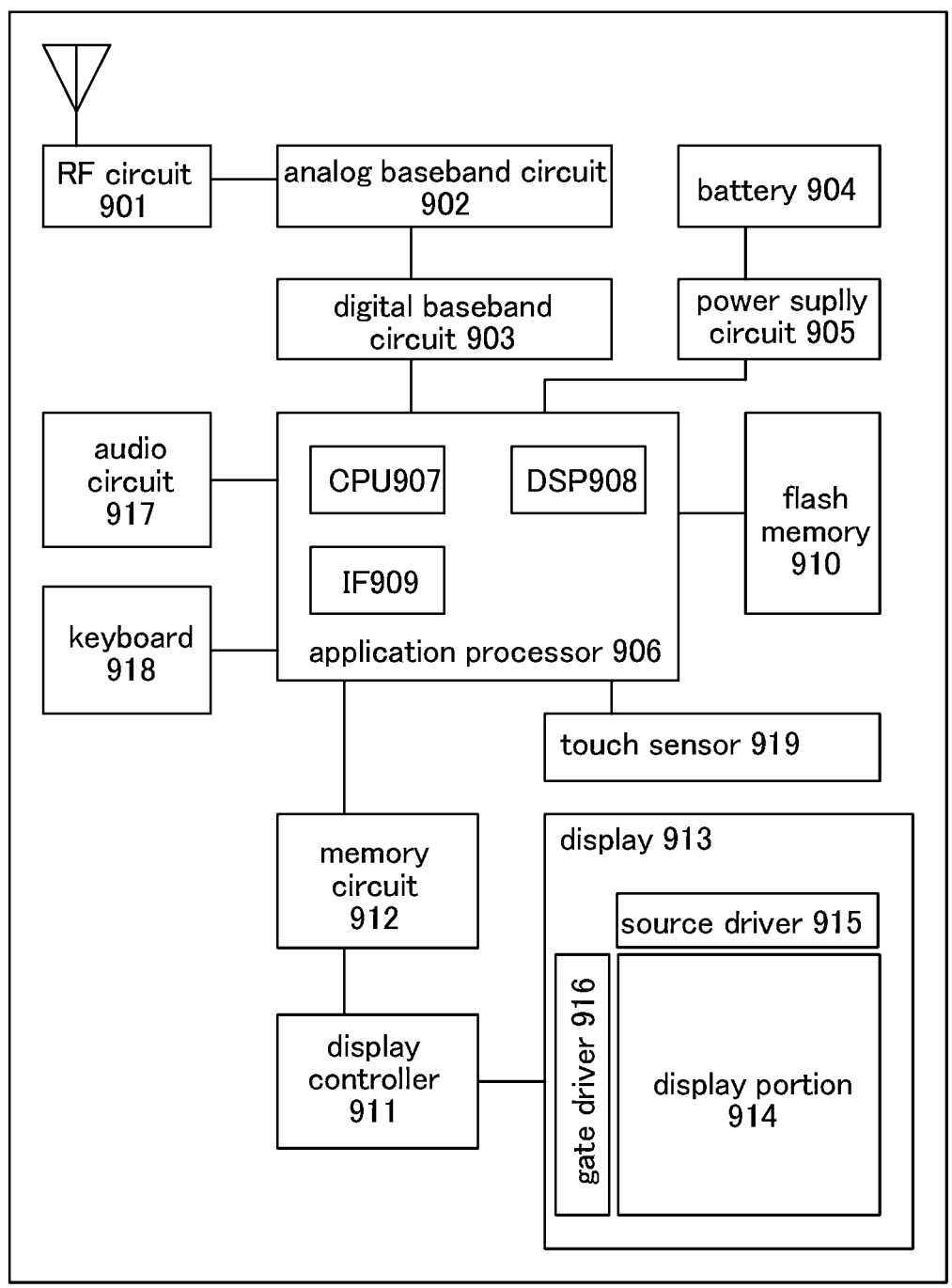
FIG. 13 is a block diagram of one embodiment of a semiconductor device.

A block diagram of a portable device is illustrated in FIG. 13. The portable device illustrated in FIG. 13 includes an RF circuit 901, an analog baseband circuit 902, a digital baseband circuit 903, a battery 904, a power supply circuit 905, an application processor 906, a flash memory 910, a display controller 911, a memory circuit 912, a display 913, a touch sensor 919, an audio circuit 917, a keyboard 918, and the like. The display 913 includes a display portion 914, a source driver 915, and a gate driver 916. The application processor 906 includes a CPU 907, a DSP 908, and an interface 909 (IF 909). In general, the memory circuit 912 includes an SRAM or a DRAM; by employing the semiconductor device described in any of the above embodiments for the memory circuit 912, writing and reading of data can be performed at high speed, data can be held for a long time, and power consumption can be sufficiently reduced.

Figure 14:
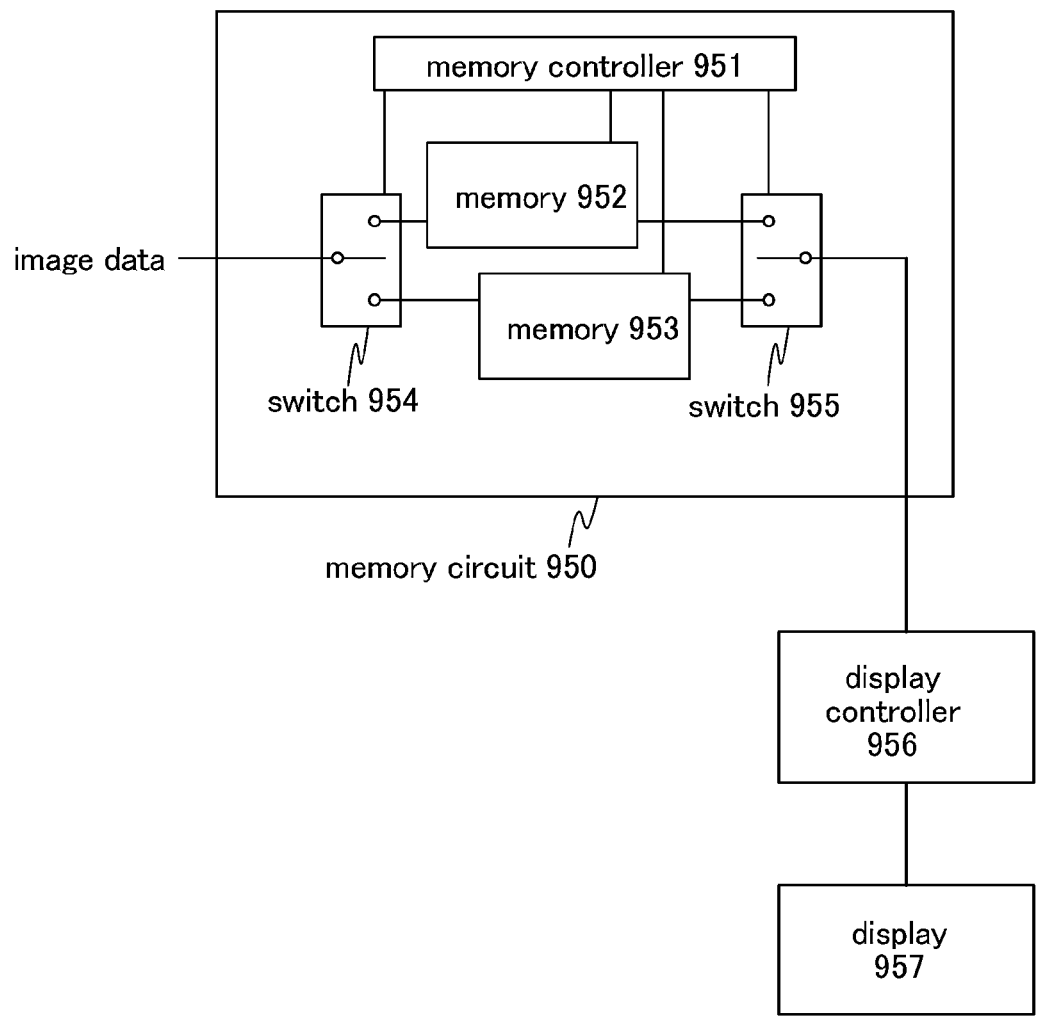
FIG. 14 is a block diagram of one embodiment of a semiconductor device.

FIG. 14 illustrates an example in which the semiconductor device described in any of the above embodiments is used for a memory circuit 950 in a display. The memory circuit 950 illustrated in FIG. 14 includes a memory 952, a memory 953, a switch 954, a switch 955, and a memory controller 951. Furthermore, the memory circuit is connected to a display controller 956 which reads and controls image data input through a signal line (input image data) and data stored in the memories 952 and 953 (stored image data). The memory circuit is also connected to a display 957 which displays an image based on a signal input from the display controller 956.

First, image data (input image data A) is formed by an application processor (not illustrated). The input image data A is stored in the memory 952 though the switch 954. The image data stored in the memory 952 (stored image data A) is transmitted to the display 957 through the switch 955 and the display controller 956, and is displayed on the display 957.

In the case where the input image data A is not changed, the stored image data A is read from the memory 952 through the switch 955 by the display controller 956 with a frequency of about 30 Hz to 60 Hz in general.

Next, for example, when data displayed on the screen is rewritten by a user (that is, in the case where the input image data A is changed), new image data (input image data B) is formed by the application processor. The input image data B is stored in the memory 953 through the switch 954. Also during that time, the stored image data A is read periodically from the memory 952 through the switch 955. After the completion of storing the new image data (the stored image data B) in the memory 953, from the next frame for the display 957, the stored image data B starts to be read, transmitted to the display 957 through the switch 955 and the display controller 956, and is displayed on the display 957. This reading operation is continued until another new image data is stored in the memory 952.

By alternately writing and reading image data to and from the memory 952 and the memory 953 as described above, images are displayed on the display 957. Note that the memory 952 and the memory 953 are not limited to separate memories, and a single memory may be divided and used. By employing the semiconductor device described in any of the above embodiments for the memory 952 and the memory 953, data can be written and read at high speed and held for a long time, and power consumption can be sufficiently reduced.

Figure 15:
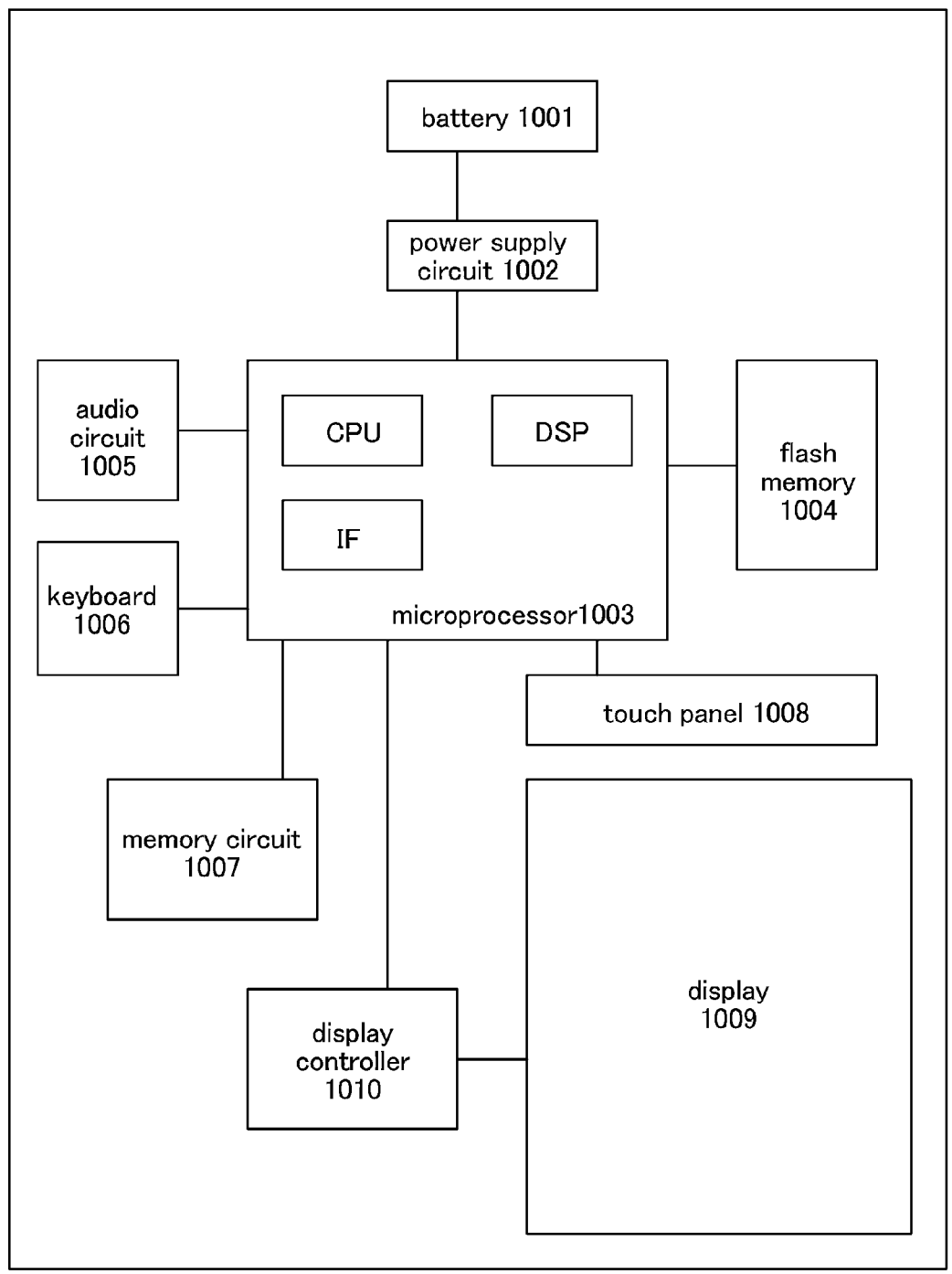
FIG. 15 is a block diagram of one embodiment of a semiconductor device.

FIG. 15 illustrates a block diagram of an e-book reader. FIG. 15 includes a battery 1001, a power supply circuit 1002, a microprocessor 1003, a flash memory 1004, an audio circuit 1005, a keyboard 1006, a memory circuit 1007, a touch panel 1008, a display 1009, and a display controller 1010.

Here, the semiconductor device described in any of the above embodiments can be used for the memory circuit 1007 in FIG. 15. The memory circuit 1007 has the function of temporarily holding the contents of a book. For example, users use a highlight function in some cases. When users read an e-book reader, they sometimes want to mark a specified place. This marking refers to a highlight function, and users can make difference from other places by, for example, changing the color of a letter displayed, underlining a word, making a letter bold, or changing the font type of a letter. In the function, data of the part specified by the users is stored and held. In order to save data for a long time, the data may be copied into the flash memory 1004. Even in such a case, by employing the semiconductor device described in any of the above embodiments, writing and reading of data can be performed at high speed, data can be held for a long time, and power consumption can be sufficiently reduced.

As described above, the semiconductor device in any of the above embodiments is mounted on each of the portable devices described in this embodiment. Thus, a portable device which writes and reads data at high speed, can hold data for a long time, and has low power consumption can be provided.

The structures and methods described in this embodiment can be combined as appropriate with any of the structures and methods described in the other embodiments. This application is based on Japanese Patent Application serial no. 2011-225693 filed with Japan Patent Office on Oct. 13, 2011, the entire contents of which are hereby incorporated by reference.

What is claimed is:

1. A semiconductor device comprising:
   a source electrode layer;
   a drain electrode layer;
   an oxide semiconductor layer;
   a channel protection layer in contact with a top surface of the oxide semiconductor layer;
   a gate insulating layer in contact with top surfaces of the channel protection layer, the source electrode layer, and the drain electrode layer;
   a gate electrode layer overlapping with the oxide semiconductor layer with the channel protection layer and the gate insulating layer provided therebetween; and
   a first sidewall layer and a second sidewall layer,
   wherein one side surface of the oxide semiconductor layer is in contact with a side surface of the source electrode layer and the other side surface of the oxide semiconductor layer is in contact with a side surface of the drain electrode layer,
   wherein the source electrode layer, the drain electrode layer and the oxide semiconductor layer are provided over a surface of a substrate,
   wherein the top surfaces of the channel protection layer, the source electrode layer and the drain electrode layer are planarized so that maximum height thereof from the surface of the substrate are the same as one another,
   wherein the first sidewall layer is in contact with one side surface of the gate electrode layer and the second sidewall layer is in contact with the other side surface of the gate electrode layer, and
   wherein the first sidewall layer and the second sidewall layer have conductivity.

2. The semiconductor device according to claim 1,
   wherein the oxide semiconductor layer comprises a first impurity region in contact with at least a part of the source electrode layer and a second impurity region in contact with at least a part of the drain electrode layer.

3. The semiconductor device according to claim 1,
   wherein the top surface of the oxide semiconductor layer is depressed from the top surfaces of the source electrode layer and the drain electrode layer.

4. The semiconductor device according to claim 1, further comprising:
   an insulating layer over the first sidewall layer, the second sidewall layer, and the gate electrode layer;
   wherein the insulating layer comprises an aluminum oxide layer.

5. The semiconductor device according to claim 1,
   wherein an area covered by the gate insulating layer is larger than an area covered by the channel protection layer.

6. The semiconductor device according to claim 1, wherein the oxide semiconductor layer comprises a crystalline portion.

7. The semiconductor device according to claim 6, wherein the crystalline portion includes crystals whose c-axes are aligned.

8. The semiconductor device according to claim 1, wherein the oxide semiconductor layer contains indium, gallium and zinc.

9. The semiconductor device according to claim 1, wherein each of the side surfaces of the oxide semiconductor layer is tapered.

10. The semiconductor device according to claim 1,
    wherein at least a part of the first sidewall layer is provided over the source electrode layer with the gate insulating layer provided therebetween, and
    wherein at least a part of the second sidewall layer is provided over the drain electrode layer with the gate insulating layer provided therebetween.

11. A semiconductor device comprising:
a source electrode layer;
a drain electrode layer;
an oxide semiconductor layer;
a channel protection layer in contact with a top surface of the oxide semiconductor layer;
a gate insulating layer in contact with top surfaces of the channel protection layer, the source electrode layer, and the drain electrode layer;
a gate electrode layer overlapping with the oxide semiconductor layer with the channel protection layer and the gate insulating layer provided therebetween; and
a first sidewall layer and a second sidewall layer,
wherein the channel protection layer comprises an oxygen-excess region,
wherein one side surface of the oxide semiconductor layer is in contact with a side surface of the source electrode layer and the other side surface of the oxide semiconductor layer is in contact with a side surface of the drain electrode layer,
wherein the source electrode layer, the drain electrode layer and the oxide semiconductor layer are provided over a surface of a substrate,
wherein the top surfaces of the channel protection layer, the source electrode layer and the drain electrode layer are planarized so that maximum height thereof from the surface of the substrate are the same as one another,
wherein the first sidewall layer is in contact with one side surface of the gate electrode layer and the second sidewall layer is in contact with the other side surface of the gate electrode layer, and
wherein the first sidewall layer and the second sidewall layer have conductivity.

12. The semiconductor device according to claim 11,
wherein the oxide semiconductor layer comprises a first impurity region in contact with at least a part of the source electrode layer and a second impurity region in contact with at least a part of the drain electrode layer.

13. The semiconductor device according to claim 11,
wherein the top surface of the oxide semiconductor layer is depressed from the top surfaces of the source electrode layer and the drain electrode layer.

14. The semiconductor device according to claim 11, further comprising:
an insulating layer over the first sidewall layer, the second sidewall layer, and the gate electrode layer;
wherein the insulating layer comprises an aluminum oxide layer.

15. The semiconductor device according to claim 11,
wherein an area covered by the gate insulating layer is larger than an area covered by the channel protection layer.

16. The semiconductor device according to claim 11, wherein the oxide semiconductor layer comprises a crystalline portion.

17. The semiconductor device according to claim 16, wherein the crystalline portion includes crystals whose c-axes are aligned.

18. The semiconductor device according to claim 16, wherein the oxide semiconductor layer contains indium, gallium and zinc.

19. The semiconductor device according to claim 16, wherein each of the side surfaces of the oxide semiconductor layer is tapered.

20. The semiconductor device according to claim 16,
wherein at least a part of the first sidewall layer is provided over the source electrode layer with the gate insulating layer provided therebetween, and
wherein at least a part of the second sidewall layer is provided over the drain electrode layer with the gate insulating layer provided therebetween.

* * * * *